United States Patent
Oktem et al.

(10) Patent No.: US 7,640,519 B2
(45) Date of Patent: Dec. 29, 2009

(54) METHOD AND APPARATUS FOR AUTOMATED SYNTHESIS OF MULTI-CHANNEL CIRCUITS

(75) Inventors: Levent Oktem, Sunnyvale, CA (US); Kenneth S. McElvain, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 438 days.

(21) Appl. No.: 11/491,437

(22) Filed: Jul. 21, 2006

(65) Prior Publication Data

US 2006/0265685 A1 Nov. 23, 2006

Related U.S. Application Data

(63) Continuation of application No. 10/407,678, filed on Apr. 4, 2003, now Pat. No. 7,093,204.

(51) Int. Cl.
*G06F 17/50* (2006.01)

(52) U.S. Cl. .................. 716/1; 716/6; 716/17; 375/349

(58) Field of Classification Search ..................... 716/1, 716/6, 17
See application file for complete search history.

(56) References Cited

U.S. PATENT DOCUMENTS 5,745,837 A * 4/1998 Fuhrmann .................... 725/114
7,145,972 B2 * 12/2006 Kumar et al. ............... 375/349

2003/0135716 A1 7/2003 Vinitzky
2006/0149927 A1 7/2006 Dagan et al.
2007/0005942 A1 1/2007 Vinitzky et al.

FOREIGN PATENT DOCUMENTS

WO   PCT/IL2006/000280        9/2006

OTHER PUBLICATIONS

Habinc, Sandi "Functional Triple Modular Redundancy (FTMR)" Design and Assessment Report, pp. 1-56. European Space Agency Contract Report, Gaisler Research, Sweden, FPGA-003-01 Version 0.2 Dec. 2002 www.gaisler.com.
Lyons, R.E.; Vanderkulk, W.; "The Use of Triple-Modular Redundancy to Improve Computer Reliability" pp. 200-209. Apr. 1962, IBM Journal.
Weaver, Nicholas; Markovskiy, Yury; Patel, Yatish; Wawrzynek, John; "Post-Placement C-Slow Retiming for the Xilinx Virtex FPGA" 10 pages. Copyright 2003 ACM 1-58113-651—X/03/0002 FPGA '03, Feb. 23-25, Monterey, California USA.

(Continued)

*Primary Examiner*—Thuan Do
(74) *Attorney, Agent, or Firm*—Blakely, Sokoloff, Taylor & Zafman LLP

(57) ABSTRACT

Methods and apparatuses to automatically generate time multiplexed multi-channel circuits from single-channel circuits. At least one embodiment of the present invention automatically and efficiently synthesize multi-channel hardware for time-multiplexed resource sharing by automatically generating a time multiplexed design of multi-channel circuits from the design of a single-channel circuit. Channel specific elements of the single-channel design (e.g., registers and memories) are replaced with corresponding elements of N-times more capacity for pipelining the signal processing for multiple channels.

6 Claims, 25 Drawing Sheets

OTHER PUBLICATIONS

Notification to Pay Additional Fees for International Application No. PCT/US2004/010006, mailed Jun. 23, 2005, 8 pages. European Patent Office, Rijswijk. Authorized Officer: Iveta Bujanska.

Shalash, Ahmad F., et al., "Power Efficient Fir Folding Transformation For Wireline Digital Communications", Copyright 1998 IEEE, 0-7803-5148-7/98, pp. 1816-1820.

Sundararajan, Vijay, et al., "Synthesis of Low Power Folded Programmable Coefficient Fir Digital Filters", Copyright 2000, IEEE, 0-7803-5973-9/00, pp. 153-156.

Lin, John, et al., "A New Multi-Algorithm Multichannel Cascadable Digital Filter Processor", IEEE 1988 Custom Integrated Circuits Conference, CH2584-1/88/0000-0060. Copyright 1988 IEEE. pp. 10.7.1-10.7.5.

Hassoun, Soha, et al., "Architectural Retiming: Pipelining Latency-Constrained Circuits" Copyright 1996 ACM, Inc. 0-89791-833-9/96/ 0006, pp. 708-713. $33^{rd}$ Design Automation Conference. XP-002330653.

Parhi, Keshab K., et al, "Synthesis of Control Circuits in Folded Pipeline DSP Architectures", Copyright 1992 IEEE, 0018-9200/ 92503.00 vol. 27, No. 1, Jan. 1992. pp. 29-43.

PCT Notification Of Transmittal Of The International Search Report And The Written Opinion Of The International Searching Authority, Or The Declaration, for PCT International Appln No. US2004/ 010006, mailed Sep. 2, 2005, (17 pages total).

James E. Thornton: "Parallel Operation in the Control Data 6600", *AFIPS Proc. FJCC*, pt. 2 vol. 26, pp. 33-40, 1964.

Eran Halperin; Uri Zwick: "Combinatorial Approximation Algorithms for the Maximum Directed Cut Problem", Proceedings of 12th Symposium on Discrete Algorithms, pp. 1-7, 2001.

Keshab K. Parhi: "*VLSI digital signal processing systems: design and implementation*", Wiley-Interscience, pp. 91-118 & 149-187, 1999.

Jhon J. Leon Franco; Miguel A. Melgarejo: "FPGA Implementation of a Serial Organized DA Multichannel FIR Filter", *Tenth ACM International Symposium on Field Programmable Gate Arrays*, Monterey, California, Feb. 24-26, 2002.

U.S. Appl. No. 60/429,014, filed Nov. 26, 2002, 48pgs.

* cited by examiner

METHOD AND APPARATUS FOR AUTOMATED SYNTHESIS OF MULTI-CHANNEL CIRCUITS

This application is a continuation of U.S. patent application Ser. No. 10/407,678, filed on Apr. 4, 2003 now U.S. Pat. No. 7,093,204.

FIELD OF THE INVENTION

The invention relates to digital circuits, and more particularly to the automated synthesis of multi-channel hardware.

BACKGROUND OF THE INVENTION

For the design of digital circuits (e.g., on the scale of Very Large Scale Integration (VLSI) technology), designers often employ computer-aided techniques. Standard languages such as Hardware Description Languages (HDLs) have been developed to describe digital circuits to aid in the design and simulation of complex digital circuits. Several hardware description languages, such as VHDL and Verilog, have evolved as industry standards. VHDL and Verilog are general-purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist, which can be used to create circuits in the vendor's technology/architecture. It is well known that FPGA vendors utilize different technology/architecture to implement logic circuits within their integrated circuits. Thus, the technology independent RTL netlist is mapped to create a netlist, which is specific to a particular vendor's technology/architecture.

In designing a circuit, transformations are frequently performed to optimize certain design goals. For example, transformations may be performed to reduce the area used by a circuit. Folding transformation is one of the systematical approaches to reduce the silicon area used by an integrated circuit. By executing multiple algorithm operations on a single function unit, the number of functional units in the implementation can be reduced. More details about folding transformations can be found in "VLSI digital signal processing systems: design and implementation", by Keshab K. Parhi, Wiley-Interscience, 1999.

Time multiplexed resource sharing has been used in the digital circuitry. For example, Peripheral and Control Processors (PACPs) of the CDC 6600 computer, described by J. E. Thornton in "Parallel Operations in the Control Data 6600", AFIPS Proceedings FJCC, Part 2, Vol. 26, 1964, pp. 33-40, share execution hardware by gaining access to common resources in a round-robin fashion. Another example about resource sharing for multi-channel filters can be found in: Jhon J. Leon Franco, Miguel A. Melgarejo, "FPGA Implementation of a Serial Organized DA Multichannel FIR Filter", Tenth ACM International Symposium on Field Programmable Gate Arrays, Monterey, Calif., Feb. 24-26, 2002.

A conventional folding algorithm can be used to automatically generate a design with time-multiplexed resource sharing from a given design. A conventional folding algorithm identifies the multiple algorithm operations that can be time multiplexed to a single functional unit to reduce the number of functional units (e.g., adders, multipliers). However, given a Digital Signal Processing (DSP) design, a conventional folding algorithm spends a significant amount of time in extracting parallelism and dependencies and in optimizing computation schedules. The complexity of hardware synthesis grows super-linearly with the number of logic units involved in the computation. Thus, the larger the designs, the harder it is to optimize and transform the circuitry.

SUMMARY OF THE DESCRIPTION

Methods and apparatuses to automatically generate time multiplexed multi-channel circuits from single-channel circuits are described here.

At least one embodiment of the present invention automatically and efficiently synthesize multi-channel hardware for time-multiplexed resource sharing by automatically generating a time multiplexed design of multi-channel circuits from the design of a single-channel circuit. Channel specific elements of the single-channel design (e.g., registers and memories) are replaced with corresponding elements of N-times more capacity for pipelining the signal processing for multiple channels.

In one aspect of the invention, a method to design a digital circuit includes: receiving a first design of a single-channel circuit; and automatically transforming the single-channel design to generate a second design of a time multiplexed multi-channel circuit. In one example, retiming is performed on the time multiplexed multi-channel circuit after the automatic generation of the multi-channel circuit (e.g., for improving clock frequency) In one example, a pipeline register set in the time multiplexed multi-channel circuit are identified and removed (e.g., to adjust the latency of the multi-channel circuit). In one example, a pipeline register set is inserted into the time multiplexed multi-channel circuit. In one example, an multi-state Finite-State-Machine (FSM) is generated to time multiplex access to logic elements of the first design by multiple channels; a multiplexing circuit is generated to time multiplex multiple inputs for the multiple channels onto an input line of the first design; and, a de-multiplexing circuit is generated to time de-multiplex signals from an output line in the first design into multiple outputs for the multiple channels. In one example, an element (e.g., a constant, a Random Access Memory (RAM) element, a Read Only Memory (ROM) element, a register, a flip-flop, or a negative latency register) in the first design is replaced with multiple or larger corresponding elements, each of which is accessed for one of the multiple channels according to the state of the FSM. In one example, after non-channel-specific sequential elements are identified, other sequential elements in the first design are identified as channel-specific; and, only channel-specific elements are replaced with multiple corresponding elements. The non-channel-specific sequential elements include sets of pipeline register (e.g., identified from determining a number of feed-forward cutsets of sequential elements as non-channel-specific sequential elements). In one example, the channel-specific sequential element is replaced with a cascade of multiple shifting sequential elements; in another example, the channel-specific sequential element is replaced with multiple memory elements, or a memory element with larger capacity, addressed according to the state of the FSM.

In one example, a sequential element (e.g., a flip-flop, a register, a memory element, a constant, and a negative latency register) in the first design is replaced with corresponding elements (e.g., a cascade of registers, a dual-port RAM or a RAM-shift register combo) to generate the second design. The corresponding elements are sequentially accessed in the second design according to timing for processing signals from multiple channels. In one example, the corresponding elements are a cascade of shifting elements; in another example, the corresponding elements are addressed sequentially (e.g., a memory of N memory elements is replaced with a memory with N×M memory elements for an M-channel circuit).

In one aspect of the invention, a method to design a digital circuit includes: receiving a first design of a single-channel circuit; generating a conglomerate of single-channel circuits of the first design and information indicating a parallelism in the conglomerate of single-channel circuits; and applying a folding transformation to the conglomerate of single-channel circuits using the information to generate a second design of time multiplexed multi-channel circuit. For example, the information includes information of a folding set; and, the information of folding set is used to guide a folding algorithm to perform the folding transformation. The first design of the single-channel circuit may contain negative latency registers; and, a retiming operation can be performed after the transformation.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to an or one embodiment in the present disclosure are not necessary to the same embodiment; and, such references means at least one.

At least one embodiment of the present invention seeks to automatically and efficiently synthesize multi-channel hardware for time-multiplexed resource sharing by automatically generating a time-multiplexed design of multi-channel circuits from the design of a single-channel circuit.

The complexity of hardware synthesis grows super-linearly with the number of logic units involved in the design. A multi-channel circuit typically has independent and identical single channels. An N-channel circuit typically requires N times more logical (computational) units than its single-channel counterpart in optimizing the circuit during hardware synthesis. When a conventional folding transformation is applied on the multi-channel circuit to generate a time multiplexed circuit in order to reduce the function units used, the conventional folding algorithm spends a significant amount of time in extracting parallelism and dependencies and in optimizing computation schedules. Thus, hardware synthesis optimization for time-multiplexed resource sharing is typically computationally intensive, particularly for large designs.

According to one embodiment of the present invention, the synthesis optimization for time-multiplexed resource sharing for multiple channels is based on the design of a single channel. The computation for extracting parallelism and dependencies is avoided; and, a design with time-multiplexed resource sharing can be generated from the design of a single channel without the extensive computation of the conventional folding transformation. In one example, a single-channel design is transformed into a time-multiplexed N-channel design by replacing channel specific elements of the single-channel design (e.g., registers and memories) with their counterparts having N-times more capacity to pipeline the signal processing for multiple channels. More examples and details are described below.

Many of the methods of the present invention may be performed with a digital processing system, such as a conventional, general-purpose computer system. Special purpose computers, which are designed or programmed to perform only one function, may also be used.

Figure 1:
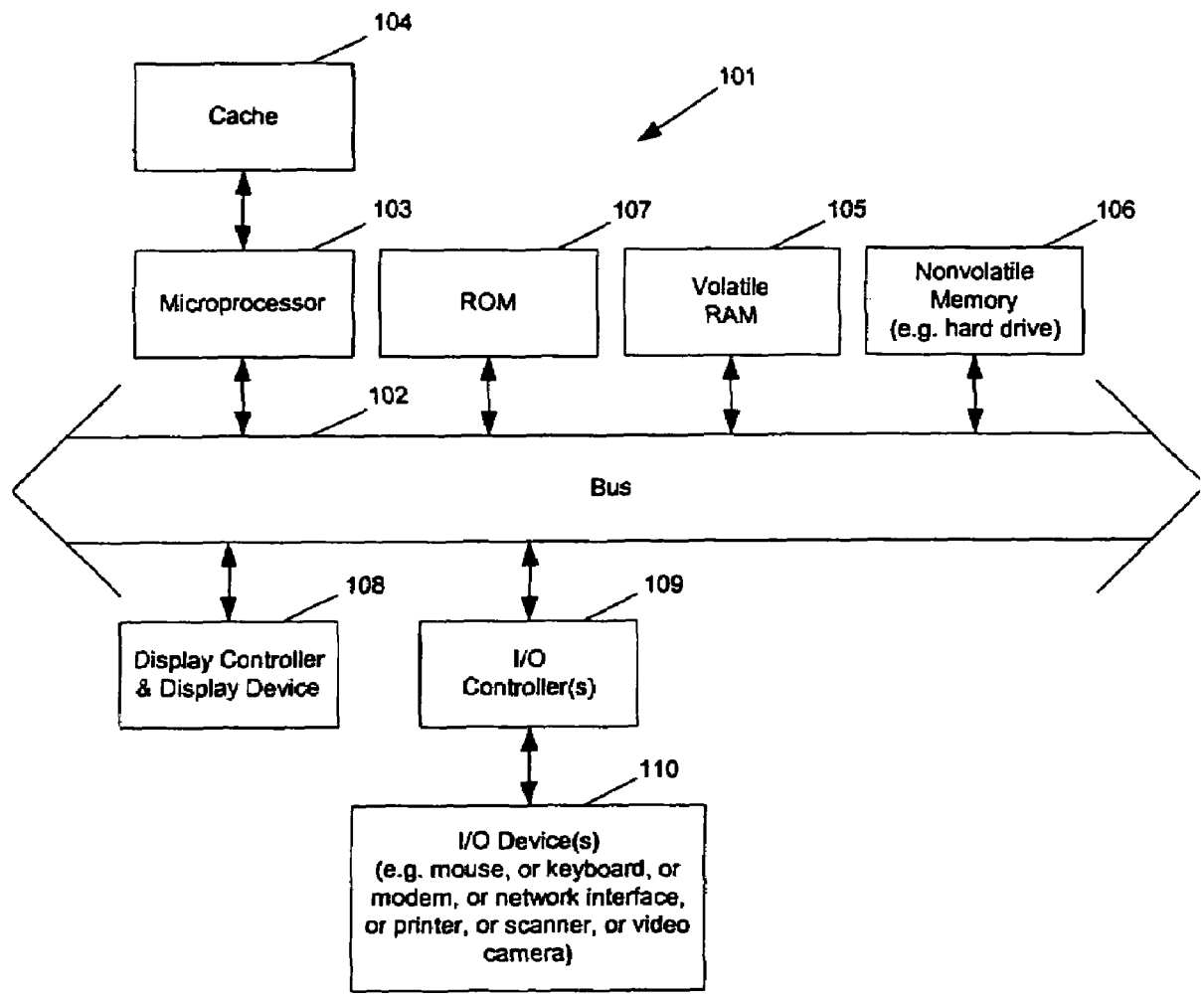
FIG. 1 shows a block diagram example of a data processing system which may be used with the present invention.

FIG. 1 shows one example of a typical computer system which may be used with the present invention. Note that while FIG. 1 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 1 may, for example, be a Sun workstation, or a personal computer (PC) running a Windows operating system, or an Apple Macintosh computer.

As shown in FIG. 1, the computer system 101, which is a form of a data processing system, includes a bus 102 which is coupled to a microprocessor 103 and a ROM 107 and volatile RAM 105 and a non-volatile memory 106. The microprocessor 103, which may be a G3 or G4 microprocessor from Motorola, Inc. or IBM is coupled to cache memory 104 as shown in the example of FIG. 1. The bus 102 interconnects these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 110 are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 1 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable medium can be used to store software and data which when executed by a data processing system causes the system to perform various methods of the present invention. This executable software and data may be stored in various places including for example ROM 107, volatile RAM 105, non-volatile memory 106 and/or cache 104 as shown in FIG. 1. Portions of this software and/or data may be stored in any one of these storage devices.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

Figure 2:
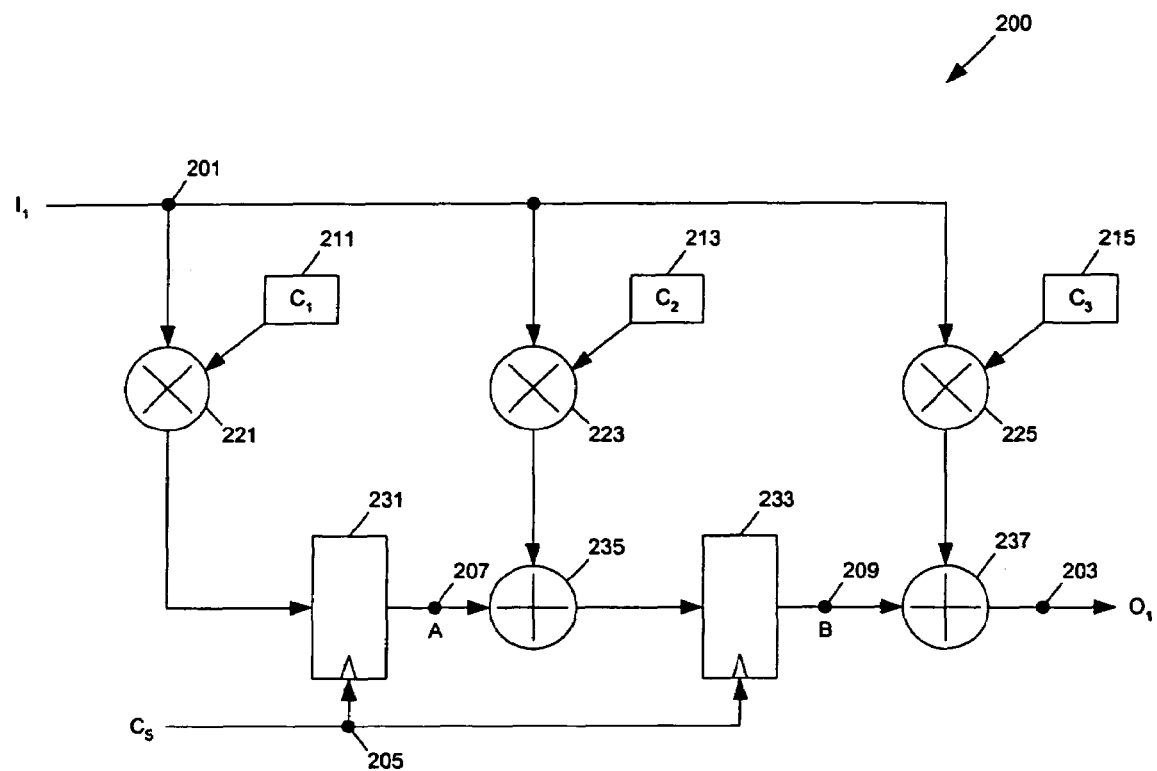
FIG. 2 shows an example of a single-channel three-tap Finite Impulse Response (FIR) filter from which a multi-channel filter can be automatically generated according to one embodiment of the present invention.

FIG. 2 shows an example of a single-channel three-tap Finite Impulse Response (FIR) filter from which a multi-channel filter can be automatically generated according to one embodiment of the present invention. Single-channel circuit 200 receives input on line 201 to generate output on line 203. The single-channel design includes constants 211, 213 and 215, multipliers 221, 223 and 225, adders 235 and 237, and registers (flip-flops) 231 and 233. Input on line 201 is multiplied by multipliers 221, 223 and 225 with constants 211, 213 and 215; and, adders 235 and 237 sum the results to generate output on line 203. Clock signal $C_S$ on line 205 controls the pipelining and the synchronization of the processing in the single-channel circuit.

Figure 3:
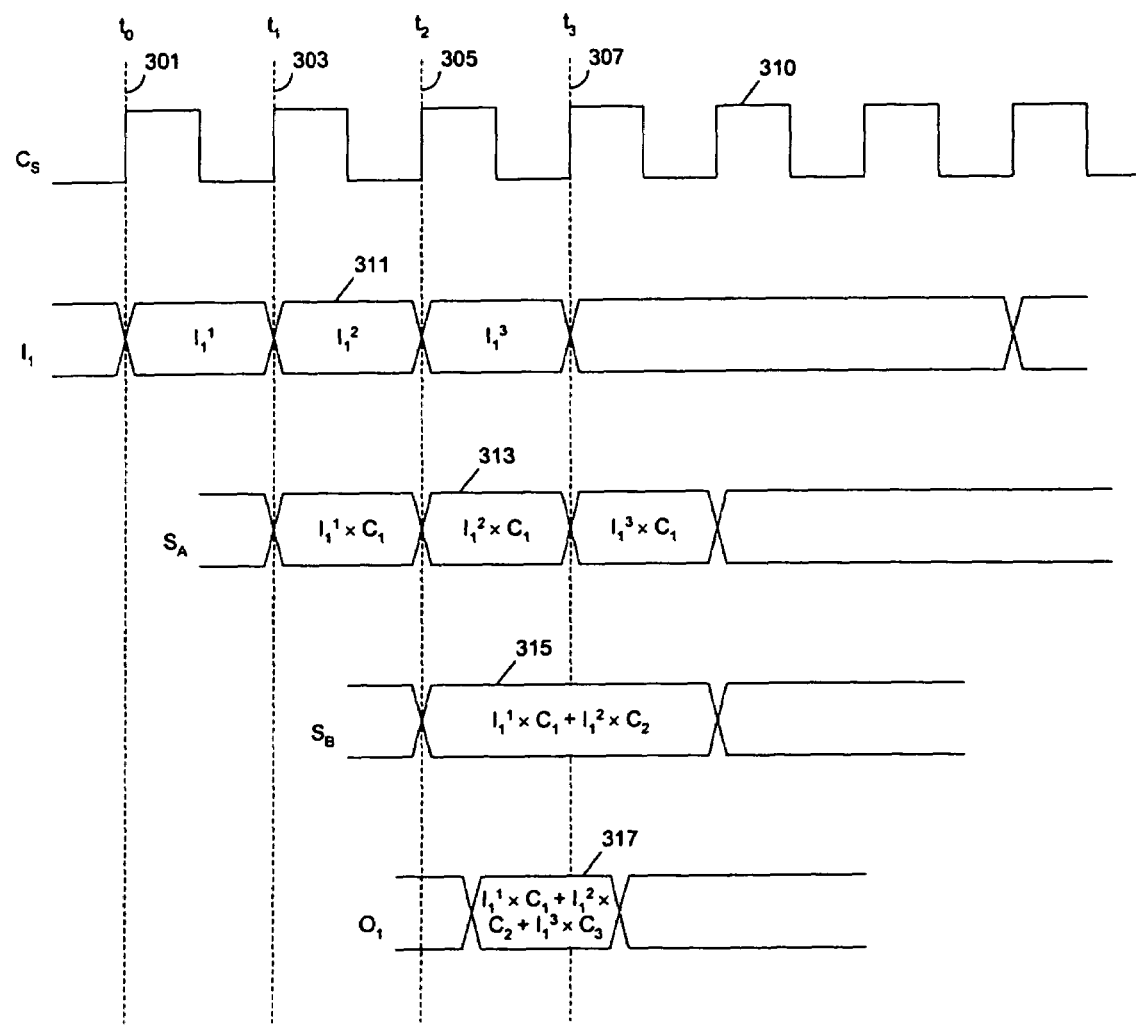
FIG. 3 shows signal waveforms at various locations in the example of FIG. 2.

FIG. 3 shows signal waveforms at various locations in the example of FIG. 2. At time $t_0$ (301), input signal $I_1$ arrives on line 201. At time $t_1$ (303), register 231 outputs the result of multiplier 221 to generate signal $S_A$ 313 on line A 207. At time $t_2$ (305), register 233 outputs the result of adder 235 to generate signal $S_B$ 315 on line B 209, which is the sum of signal $S_A$ 313 and the output of multiplier 223. At time $t_3$, adder 237 sums signal $S_B$ 315 and the output of multiplier 225 to generate signal $O_1$ 317 on output line 203.

Figure 4:
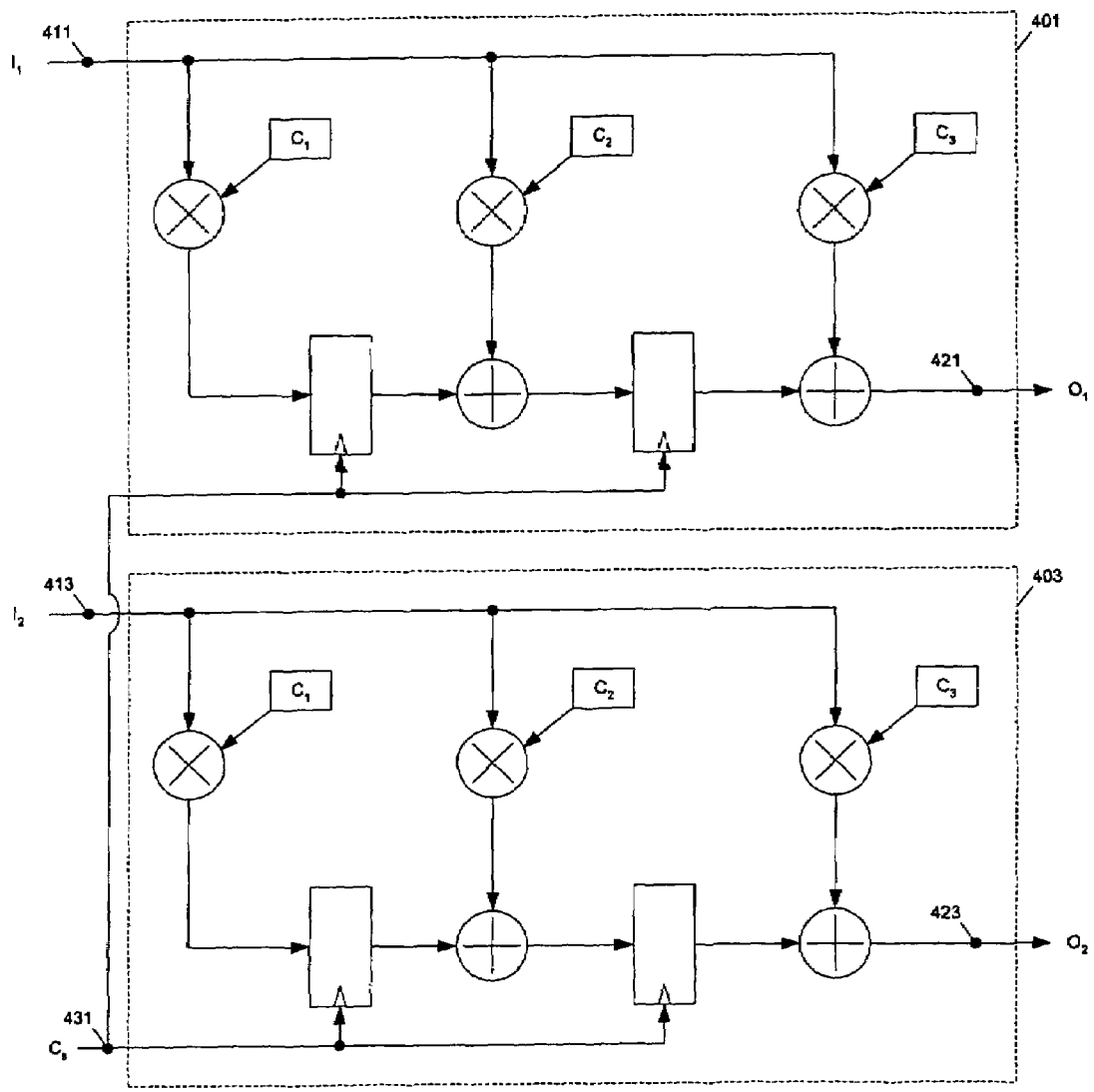
FIG. 4 shows an example of a two-channel filter corresponding to the conglomerate of single-channel filters of FIG. 2.

FIG. 4 shows an example of a two-channel filter corresponding to the conglomerate of single-channel filters of FIG. 2. For example, circuits 401 and 403 have the same elements and structure as circuit 200 in FIG. 2. The conventional solutions for the automatic synthesis of hardware systems do not handle multi-channel systems specially. The conventional methods treat a multi-channel design as a large conglomerate of single-channel systems. A conventional method typically presents the two-channel filter as shown in FIG. 4 without any indication of the inherent high level parallelism in the design. Thus, a hardware synthesis software program performs the computational intensive task of extracting parallelism and dependencies. To generate a design with time-multiplexed resource sharing, a folding transformation may be applied. Thus, the conventional method is computational intensive. Further, when a multi-channel system is interpreted as a conglomerate of single-channel systems, the inherent high level parallelism can be missed, resulting in spending much more computational resources in applying folding transformations and/or failure to sufficiently optimize the given design.

In one embodiment of the present invention, information related to the parallelism in a conglomerate of single-channel systems, which is automatically generated from the single channel design, is also generated to guide a general folding algorithm to apply folding transformation in automatically transforming the a conglomerate of single-channel systems into a time multiplexed circuit. For example, in a typical folding algorithm (e.g., those described in "VLSI digital signal processing systems: design and implementation", by Keshab K. Parhi, Wiley-Interscience, 1999, pp. 149-187, and others), it is a time consuming operation to identify folding sets. A folding set is a set of operations that is to be executed by a same functional unit through time multiplexing. When the conglomerate of single-channel systems is automatically generated from the single channel design, the folding sets can be generate without extensive computation. Such identified folding sets can be used to guide a typical folding algorithm in transforming the conglomerate of single-channel systems (e.g., traditional folding algorithms can be modified to use such information for efficient operations).

Instead of applying folding transformations to a large conglomerate of single-channel systems, at least one embodiment of the present invention explores fully the parallelism in the multi-channel circuits by applying automated transformations on the single-channel design to generate a design that enables time multiplexed resource sharing.

One embodiment of the present invention presumes multi-channel behavior from the beginning to avoid spending time in extracting parallelism and dependencies and in optimizing computation schedules, etc. Taking the single-channel version of the system as the input, it applies a simple mapping to make very effective use of the high level parallelism inherent in the multi-channel system. Since the data flows within the separate threads of the resulting multi-channel design are identical, the resulting control circuitry is minimal.

Figure 5:
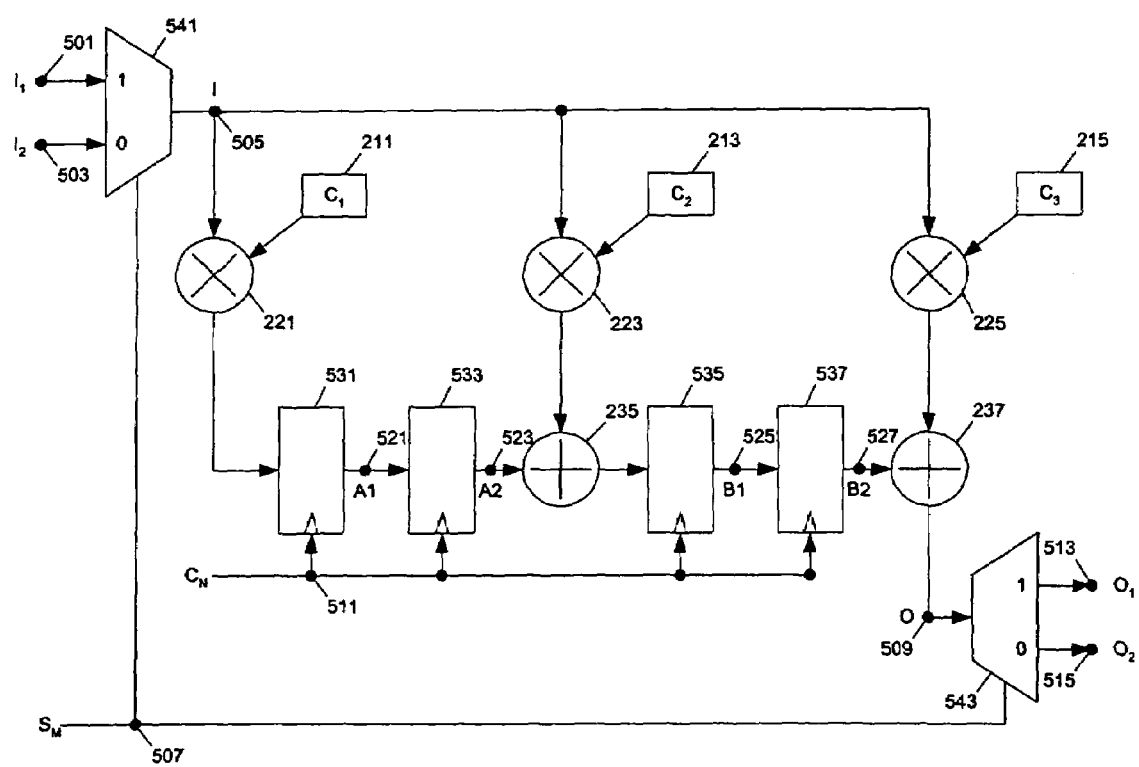
FIG. 5 shows an example of a two-channel filter automatically generated from the single-channel filter of FIG. 2 according to one embodiment of the present invention.

FIG. 5 shows an example of a two-channel filter automatically generated from the single-channel filter of FIG. 2 according to one embodiment of the present invention. Functional units (e.g., multipliers and adders) are not channel specific. Since constants C1, C2, and C3 (211, 213 and 215) are not channel specific, they can also be shared without modification. Registers are in this case channel specific. Thus, registers 231 and 233 of single-channel design 200 are replaced with cascades of 2-shift registers 531, 533 and 535, 537. Inputs 501 and 503 (e.g., corresponding to inputs 411 and 413 of channel 401 and 403 in FIG. 4) are time multiplexed by multiplexer 541 onto input line 505 according to signal $S_M$ (507); and, output 509 is de-multiplexed by de-multiplexer 543 onto lines 513 and 515 (e.g., corresponding to outputs 421 and 423 of channel 401 and 403 in FIG. 4). It is understood that the generation of multiplexer 541 (or de-multiplexer 543) is optional, depending whether or not the multiple-channel receives (or generates) signals on multiple ports.

Figure 6:
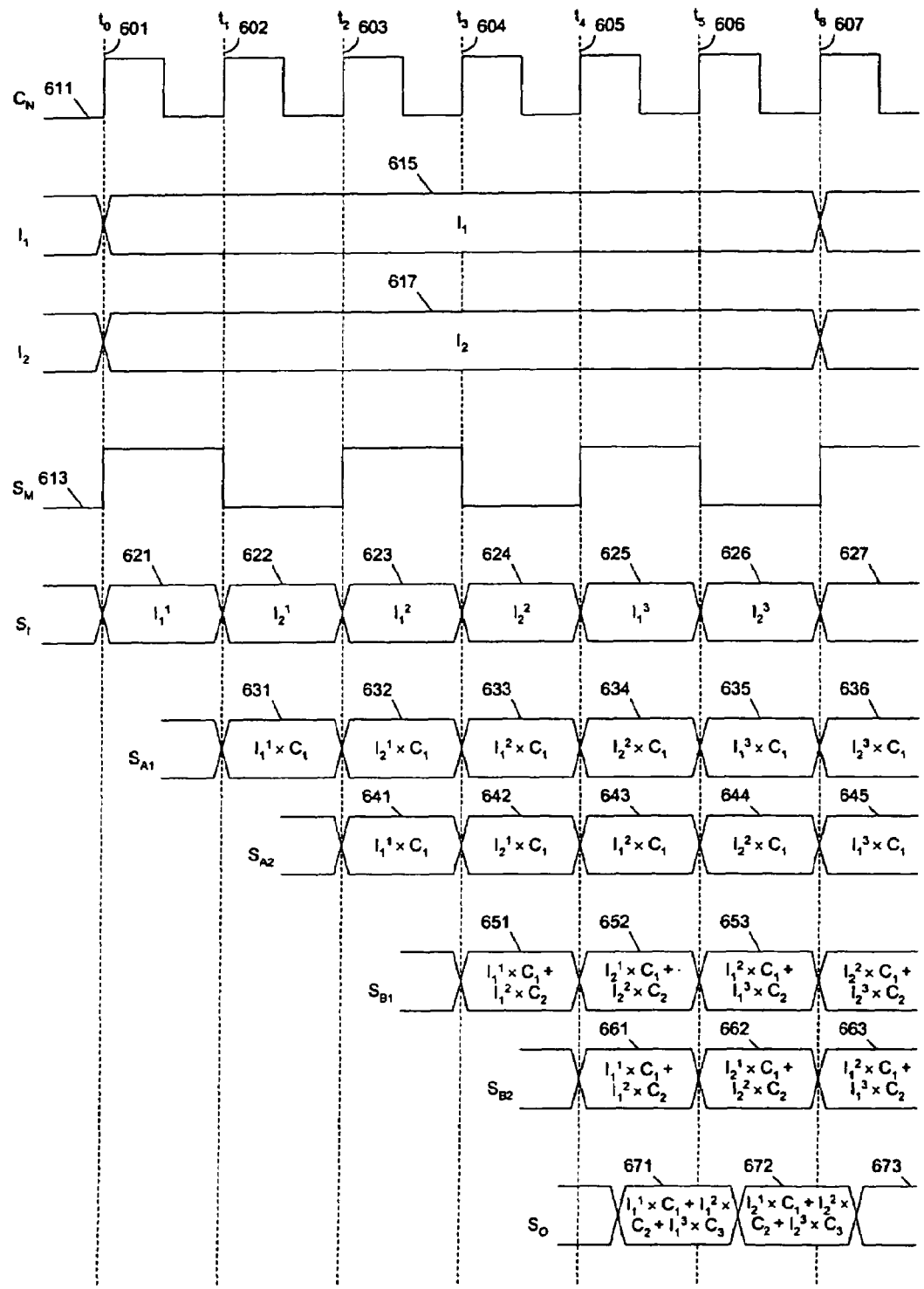
FIG. 6 shows signal waveforms at various locations in the example of FIG. 5.

FIG. 6 shows signal waveforms at various locations in the example of FIG. 5. Input signals $I_1$ (615) and $I_2$ (617) are time multiplexed as signal $S_I$ according to the state of control signal $S_M$ (613). In a typical clock cycle of the single-channel circuit (e.g., from time $t_0$ 301 to $t_1$ 303 in FIG. 3, which correspond to time $t_0$ 601 to $t_2$ 603 in FIG. 6), each input signal is assigned to one time slot (e.g., slot 621 for signal $I_1$ 615 and slot 622 for signal $I_2$ 617). The input signal assigned for a given slot is processed by the logic units and pipelined by the cascades of registers for further processing. For example, signal $I_1$ 615 assigned to slot 621 in $S_I$ is multiplied by constant 211 to generate intermediate result 631 in $S_{A1}$ at time $t_1$ on line A1 (521) from register 531. Intermediate result 631 is delayed by register 533 to output signal 641 in $S_{A2}$ on line A2 (523) at time $t_2$ 603, after which signal $I_1$ 615 is again assigned slot 623 in $S_1$ as input for multiplier 223. At time $t_3$ 604, the result of adder 235 is output from registers 535 to generate on line B1 (525) signal 651 in $S_{B1}$, which is similarly delayed by register 537 to output on line B2 (527) signal 661 in $S_{B2}$ at time $t_4$ 605, after which signal $I_1$ 615 is again assigned slot 625 in $S_1$ as input for multiplier 225. At time $t_5$ 606, signal 671 of $S_O$ on line O (509 in FIG. 5), the result from adder 237 for input signal $I_1$ 615, is ready for output by de-multiplexer 513. Similarly, signal 672 is the result of input signal $I_2$ 617, computed from the input assigned to slots 622, 624 and 626. Further, the intermediate results from previous inputs are pipelined in the system so that results based on the previous inputs are available in the intermediate next clock cycles (e.g., results based on samples 623, 625 and 627 of input $I_1$ is available at time slot 673).

Thus, FIGS. 5 and 6 illustrate that, when a register in the single-channel design is replaced by a cascade of registers, the intermediate result stored in the register of the single-channel design is pipelined in the cascade of registers in the multi-channel design so that the output the cascade of registers is synchronized with the time slot assignment for the signal processing in the multi-channel circuit. In one embodiment of the present invention, each of the channel-specific sequential elements (e.g., registers, flip-flops, memory elements) in the single-channel design is replaced with corresponding elements of N-times more capacity (e.g., a cascade of registers or flip-flops, dual-port RAM addressed according to the time slot assignment, RAM-shift register combo, and others).

Figure 7:
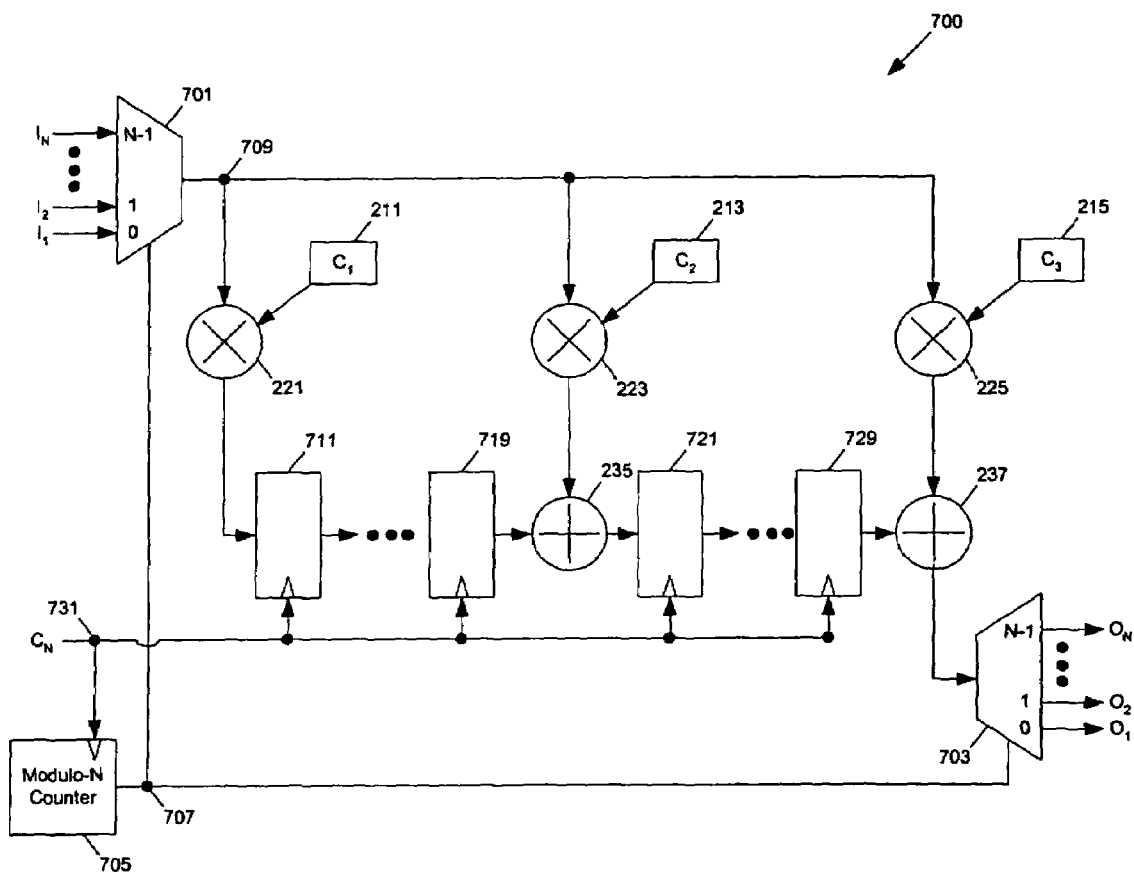
FIG. 7 shows an example of a multi-channel filter automatically generated from the single-channel filter of FIG. 2 according to one embodiment of the present invention.

FIG. 7 shows an example of a multi-channel filter automatically generated from the single-channel filter of FIG. 2 according to one embodiment of the present invention. To automatically convert single-channel design 200 of FIG. 2 into time multiplexed N-channel design 700 of FIG. 7, register 231 of FIG. 2 is replaced with a cascade of N-shift registers 711-719; and, register 233 of FIG. 2 is replaced with a cascade of N-shift registers 721-729. Modulo-N counter 705 is used to generate a signal for controlling the time slot assignment for input signals. When the output of modulo-N counter 705 on line 707 is i (i=0, 1, . . . , N−1), multiplexer 701 selects signal $I_{i+1}$ as the input signal to line 709. Similarly, the output signal from adder 237 in FIG. 7 is decoded by de-multiplexer 703 to generate output signals for corresponding channels according to the output of modulo-N counter 705.

Figure 8:
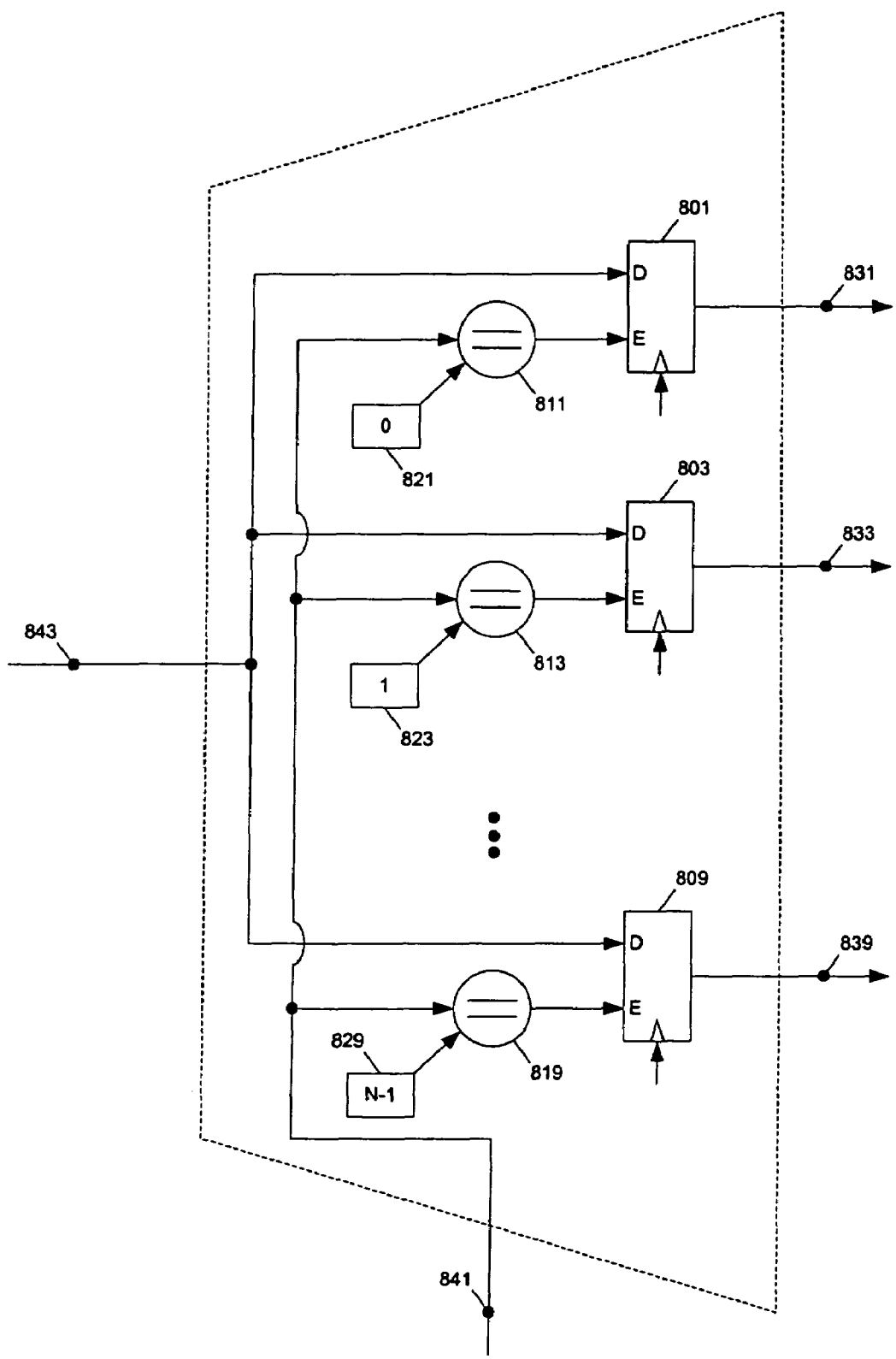
FIG. 8 shows an example of an output decoder and latch circuit for de-multiplexing outputs from a multi-channel filter according to one embodiment of the present invention.

FIG. 8 shows an example of an output decoder and latch circuit for de-multiplexing outputs from a multi-channel filter according to one embodiment of the present invention. Testers 811, 813, . . . , 819 control latches 801, 803, . . . , 809 according to the state of selection signal 841 (e.g., from modulo-N counter 705 of FIG. 7). The signal on line 843 (e.g., the output of adder 237 of FIG. 7) is latched on one of output lines 831, 833, ..., 839, when the state of the selection signal matches the corresponding one of the constants (821-829) for the testers (811-819).

Figure 9:
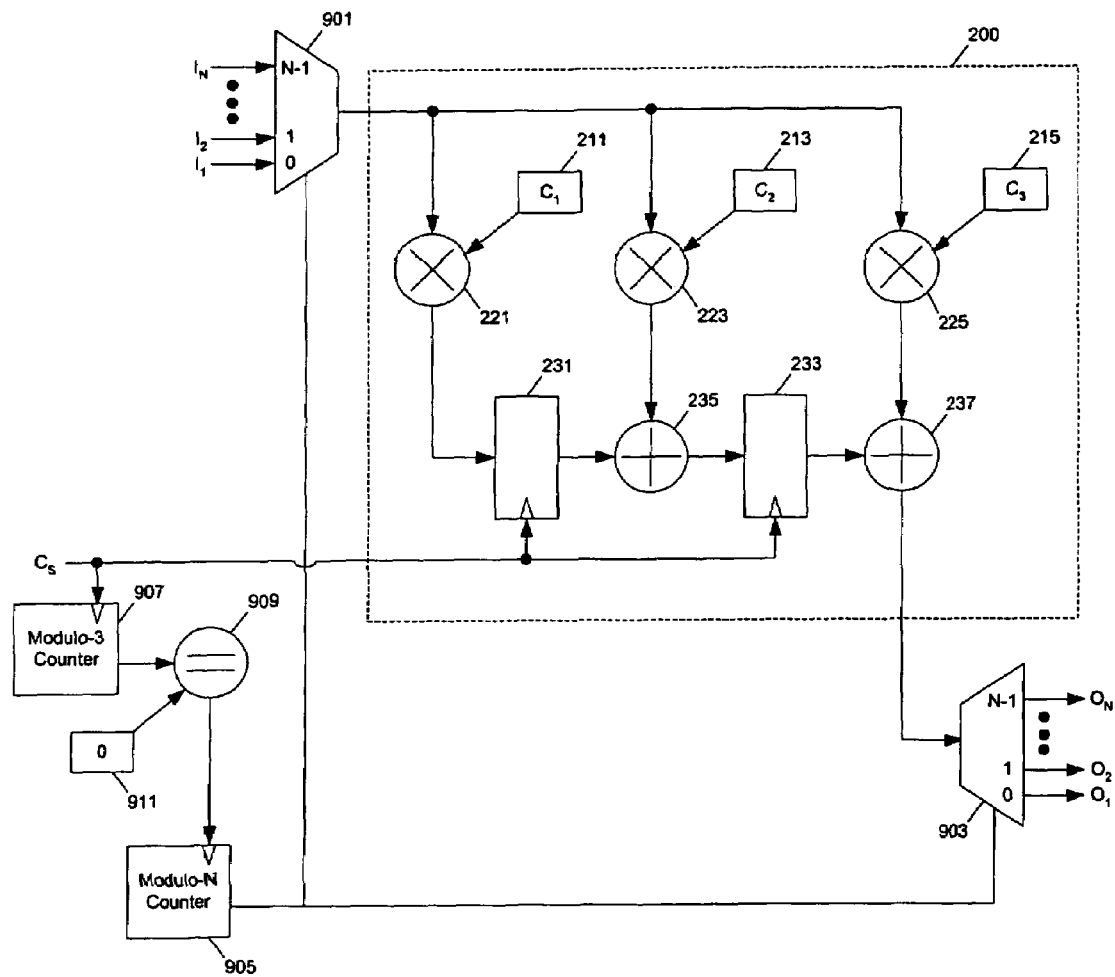
FIG. 9 shows another example of a multi-channel filter automatically generated from the single-channel filter of FIG. 2 according to an alternative embodiment of the present invention.

FIG. 9 shows another example of a multi-channel filter automatically generated from the single-channel filter of FIG. 2 according to an alternative embodiment of the present invention. In FIG. 9, circuit 200 is accessed in a round-robin fashion to process each of the input signals. Modulo-3 counter 907 allows input signals for each of the channels to be completely processed to generate an output signal before the channel is used for the processing of the signals of the next channel. Modulo-N counter 905 selects the signals of the channel to be processed by circuit 200. Although the method of FIG. 9 makes fewer modifications to the single-channel circuit in generating the multi-channel design, the circuit of FIG. 9 has a smaller throughput than the circuit of FIG. 7. The signal pipelining in the single-channel design is not fully utilized in FIG. 9 because of the round-robin scheme. Depending on the structure of the input and output signals, the latency for the processing of signals for each channel may be minimized when a multi-channel design of FIG. 9 is used. However, it is understood that, in general, the input signals for different channels do not arrive in a round-robin fashion; instead, the input signals for different channels arrive at the same time. To retiming the input signals so that the input signals arrive in a round-robin fashion, a buffer can be used between the input signal and multiplexer 901. Such a buffer samples input signals at the same time, but delays the input signals from different channels for different amount of time so that the sampled signals arrived at multiplexer 901 in a round-robin fashion.

It is noticed that the time-multiplexed multi-channel of FIG. 7 can be used directly to replace the conglomerate of single-channel systems (e.g., in FIG. 4) when the frequency of the clock signal $C_N$ (741) is N times the frequency of the clock signal of the single-channel systems (e.g., clock signal $C_S$ 431 of FIG. 4). When a design of FIG. 9 is used, an additional circuitry (e.g., a block of RAM with addressed according to the timing of the input signals and the time slot assignment for processing) can be used to retime the inputs.

In one embodiment of the present invention, each of the channel-specific elements (e.g., registers, constants, ROM or RAM) of the single-channel design is replaced with corresponding elements to pipeline the processing for multi-channel inputs. Although each of the registers (or flip-flops) can be considered a channel-specific register, which is replaced with a cascade of shifting registers, pipeline registers can be identified as non-channel-specific registers. When the pipeline registers are not replaced with cascade of shifting registers, the timing within the time-multiplexed shared channel can still be synchronized with respect to the input of the channels.

A set of pipeline registers is a feed-forward cutset of the system graph. As a feed-forward cutset of the system, the removal of the set of pipeline registers partitions the system into two disconnected subsystems, with a unidirectional flow of data between the two subsystems. However, when there are multiple inputs and/or multiple outputs in the system, the cutset that partitions the inputs into different subsystems or the outputs into different subsystems does not qualify as a set of pipeline registers, since synchronization can be distorted if such a cutset is not pipelined in generating the multi-channel design.

Feed-forward cutsets can be automatically identified using various algorithms known in the art. For example, Eran Halperin and Uri Zwick described methods in "Combinatorial approximation algorithms for the maximum directed cut problem", Proceedings of 12th Symposium on Discrete Algorithms, pp. 1-7, 2001, which can be used to determine the feed-forward cutsets. It is noticed that feed-forward cutsets are often referred to as "directed cuts" (or "dicuts") in graph theory literature. The methods of Eran Halperin and Uri Zwick for finding "maximum directed cuts" can be used to find the feed-forward cutsets containing maximum numbers of registers.

Figure 10:
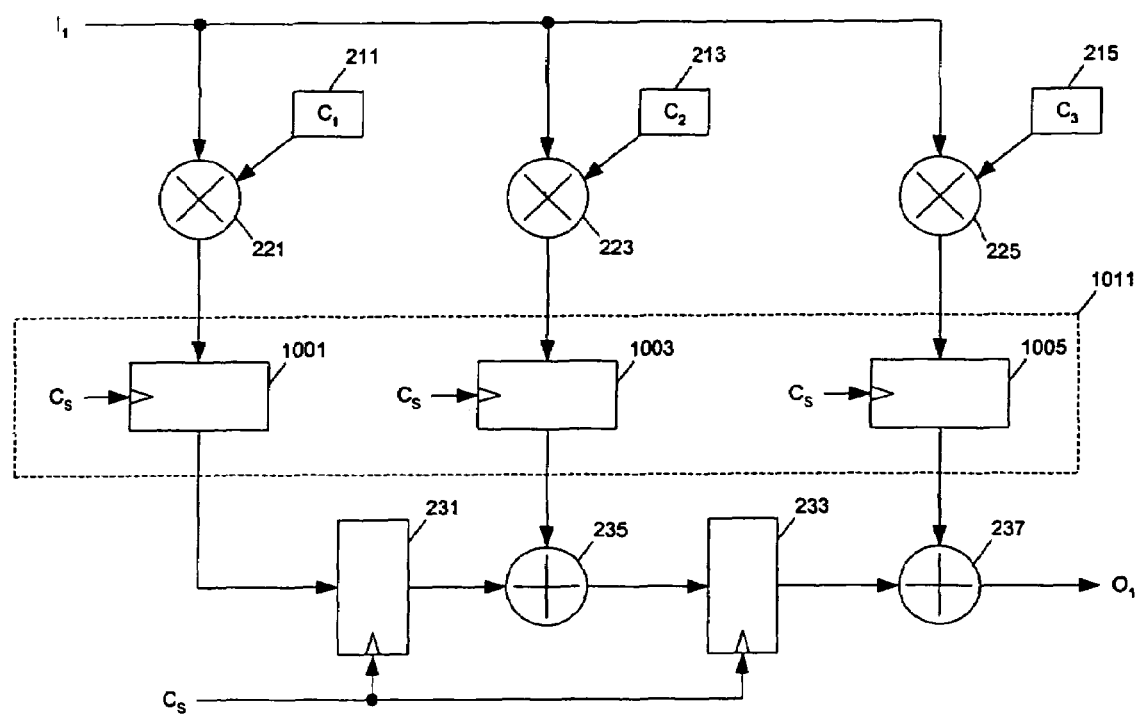
FIG. 10 shows an example of a single-channel three-tap Finite Impulse Response (FIR) filter with pipeline registers from which a multi-channel filter can be automatically generated according to one embodiment of the present invention.

FIG. 10 shows an example of a single-channel three-tap Finite Impulse Response (FIR) filter with pipeline registers from which a multi-channel filter can be automatically generated according to one embodiment of the present invention. The design of FIG. 10 includes pipeline registers 1001-1005. Feed-forward cutset 1011 partitions the system of FIG. 10 into two subsystems with a unidirectional flow of data between the two subsystems. Thus, registers 1001-1005 are identified as non-channel-specific; and thus, the channel-specific elements in the design of FIG. 10 are registers 231 and 233. Channel specific registers 231 and 233 in FIG. 10 are replaced with cascades of registers to generate time-multiplexed resource shared design of FIG. 11.

Figure 11:
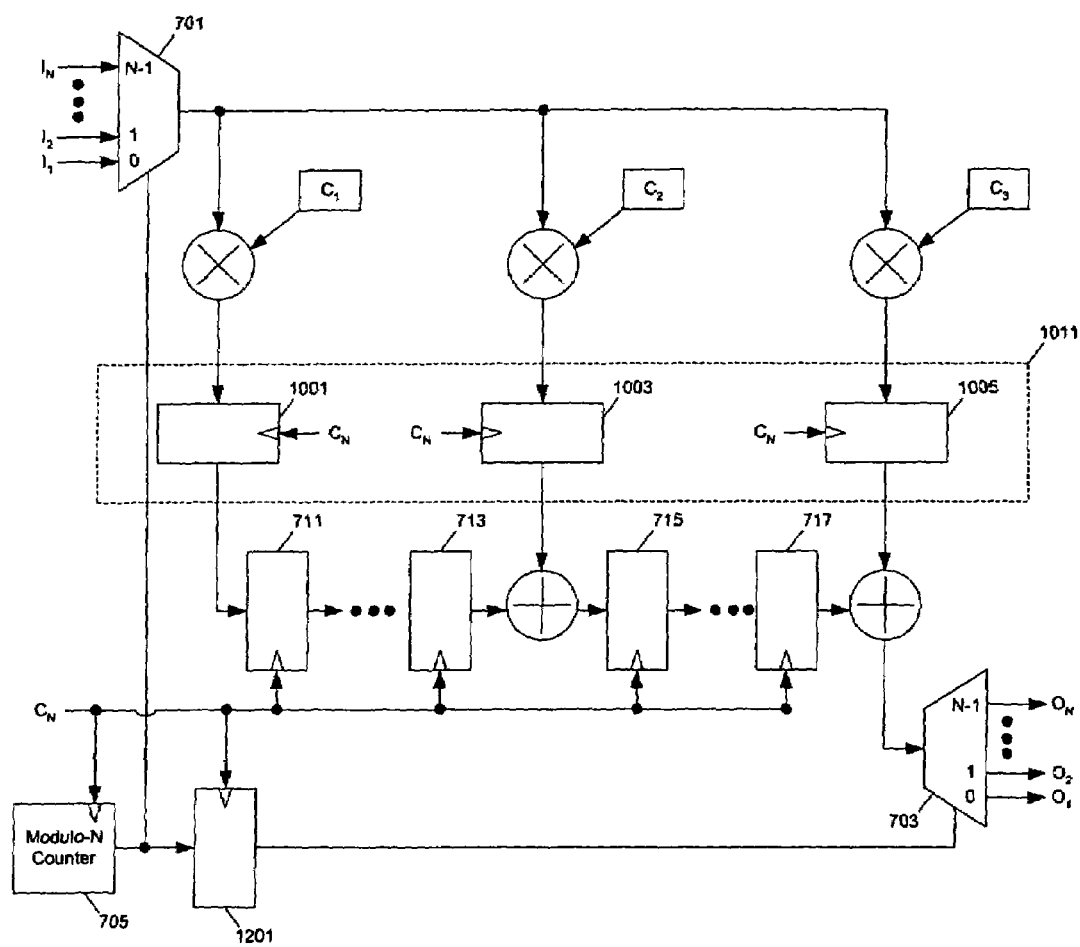
FIG. 11 shows an example of a multi-channel filter automatically generated from the single-channel filter of FIG. 10 according to one embodiment of the present invention.

FIG. 11 shows an example of a multi-channel filter automatically generated from the single-channel filter of FIG. 10 according to one embodiment of the present invention. In FIG. 11, pipeline registers 1011 remain unchanged. To synchronize the operation of the de-multiplexer 703 with the state of Modulo-N counter 705, register 1201 is inserted to delay the output of counter 705 for one cycle to offset the effect of the delay caused by cutset 1011. In general, when M sets of pipeline registers are identified as non-channel specific elements, the output of the Modulo-N counter is delayed mod(M, N) cycles to synchronized the operations of multiplexer and de-multiplexer (e.g., 701 and 703 in FIG. 11). It is also notice that registers 231, 1003 and 1005 in FIG. 10 can be identified as a set of pipeline registers, in which case registers 1001 and 233 will be replaced with cascades of shifting registers. Alternatively, if none of the registers in FIG. 10 is identified as pipeline registers, all registers in FIG. 10 are replaced with cascades of registers, in which case the resulting design will have N sets of pipeline registers and no register is necessary to delay the output of modulo-N counter 705, since mod(N,N)=0.

A channel-specific register of the single-channel system can be replaced with a cascade of N-shift registers in generating the multi-channel system. In some FPGA architectures (such as Xilinx Virtex), shift registers are natural primitives. This enables very efficient memory usage when the target architecture is one of these FPGA architectures. It is understand that each of the channel-specific registers can be also be replaced by other memory structures (e.g., an N-item dual-port RAM, or a RAM-shift register combo, or others) that can pipeline the intermediate results according to the state of the module-N counter.

Figure 12:
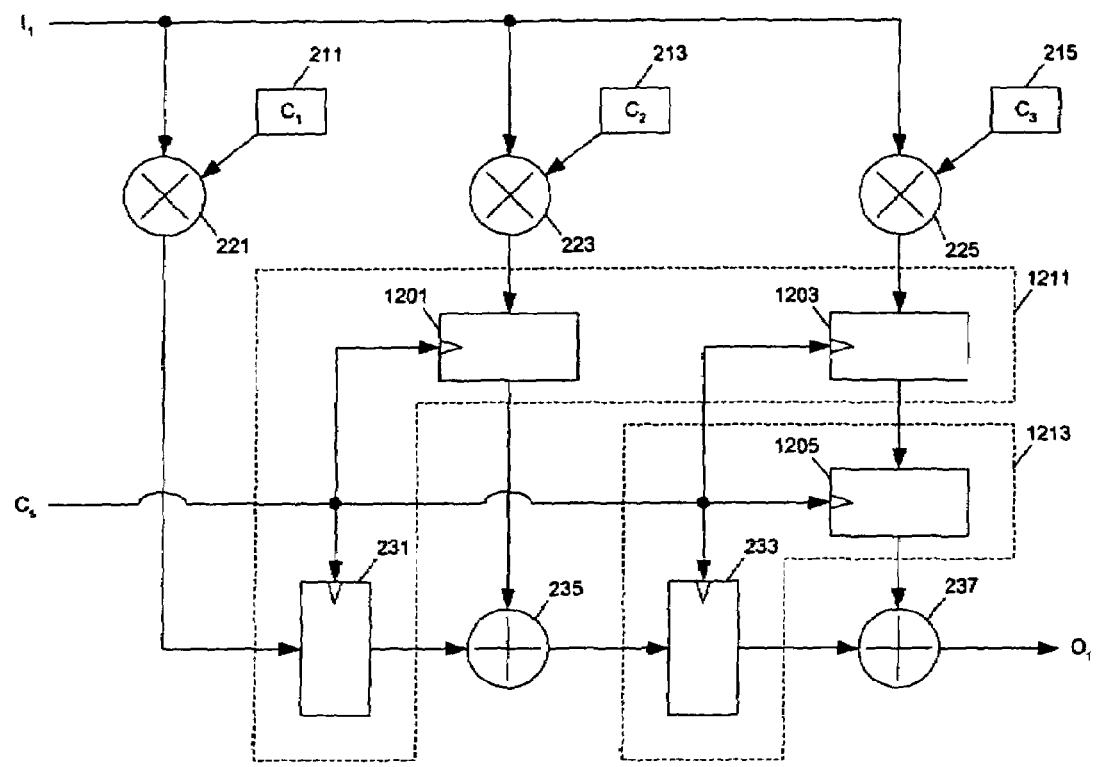
FIG. 12 shows another example of a single-channel circuit with pipeline registers from which a multi-channel filter can be automatically generated according to one embodiment of the present invention.

FIG. 12 shows another example of a single-channel circuit with pipeline registers from which a multi-channel filter can be automatically generated according to one embodiment of the present invention. The design of FIG. 12 contains feed-forward cutsets 1211 and 1213, including registers 1201, 1203, 231 and 1205, 233. Thus, all registers in FIG. 12 can be identified as non-channel specific; and, no register is replaced with a cascade of registers in generating the design of FIG. 13.

Figure 13:
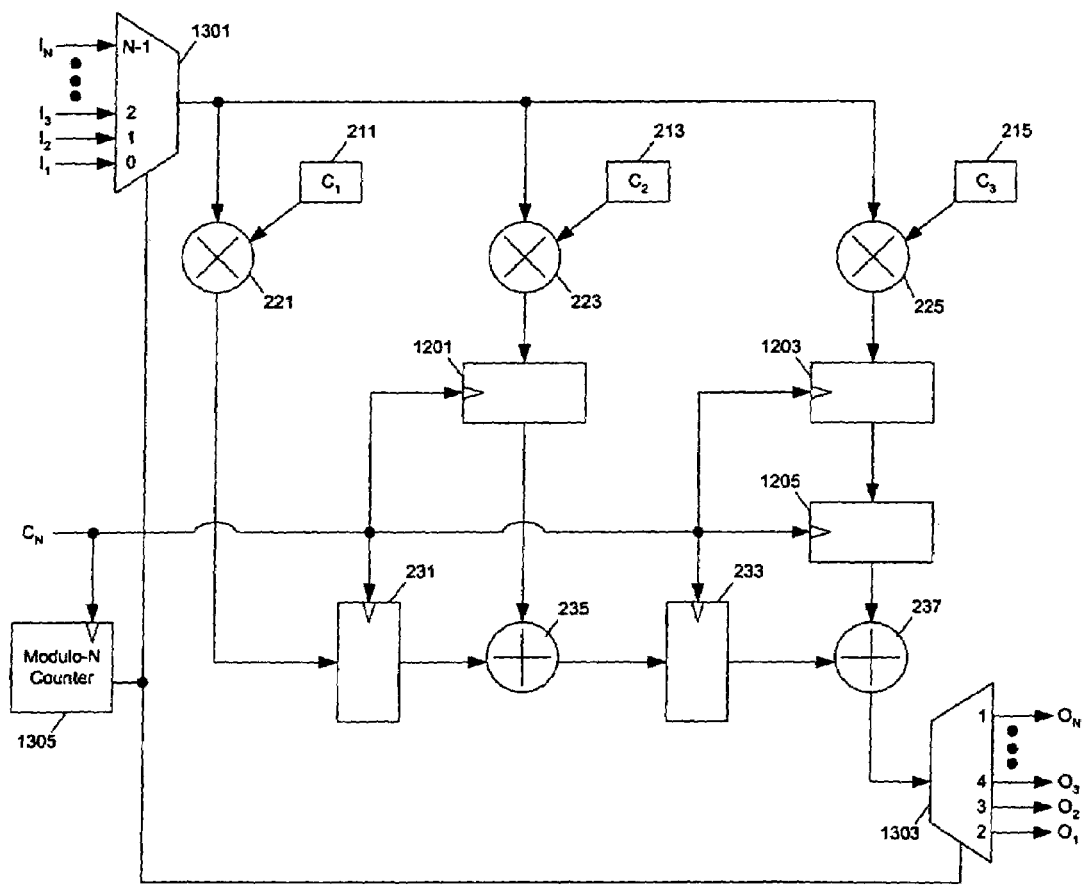
FIG. 13 shows an example of a multi-channel filter automatically generated from the single-channel filter of FIG. 12 according to one embodiment of the present invention.

FIG. 13 shows an example of a multi-channel filter automatically generated from the single-channel design of FIG. 12 according to one embodiment of the present invention. Since there are two sets of pipeline registers between multiplexer 1301 and de-multiplexer 1303, two cycles of delay can be used to synchronize the operations of the multi-channel filter. The design of FIG. 13 rotates the constants of de-multiplexer 1303 for two shifts to compensate the delay caused by the two sets of pipeline registers. Thus, when modulo-N counter outputs i (i=0, 1, . . . , N−1), multiplexer 1301 selects signal $I_{i+1}$ as the input while de-multiplexer 1303 outputs for $O_{mod(i-1,N)}$.

From the above examples, it will be apparent to one skilled in the art that different methods (e.g., inserting delay elements, shifting constants for the de-multiplexer, generating different selection signals, or combination of these) can be used to compensate the delays caused by the sets of pipeline registers that remain unchanged in the time-shared design. Further, in general, a Finite State Machine (FSM) (e.g., a modulo-N counter) can be used to control the time multiplexing of the input signals, as well as the resource sharing in the design.

Although the above examples are illustrated using a single-channel design with a single input and a single output, from this description, it will be apparent to one skilled in the art that methods of various embodiments of the present invention can also be applied to a single-channel design with multiple inputs and multiple outputs. Further, an M-channel design (M>1) can be treated as a single-channel design to automatically generate an N×M-channel design with resource sharing.

In one embodiment of the present invention, the single-channel design is optimized before and/or after the automatic transformation in generating the resource shared design for multiple channels using conventional methods (e.g., folding transformation, and others).

Figure 14:
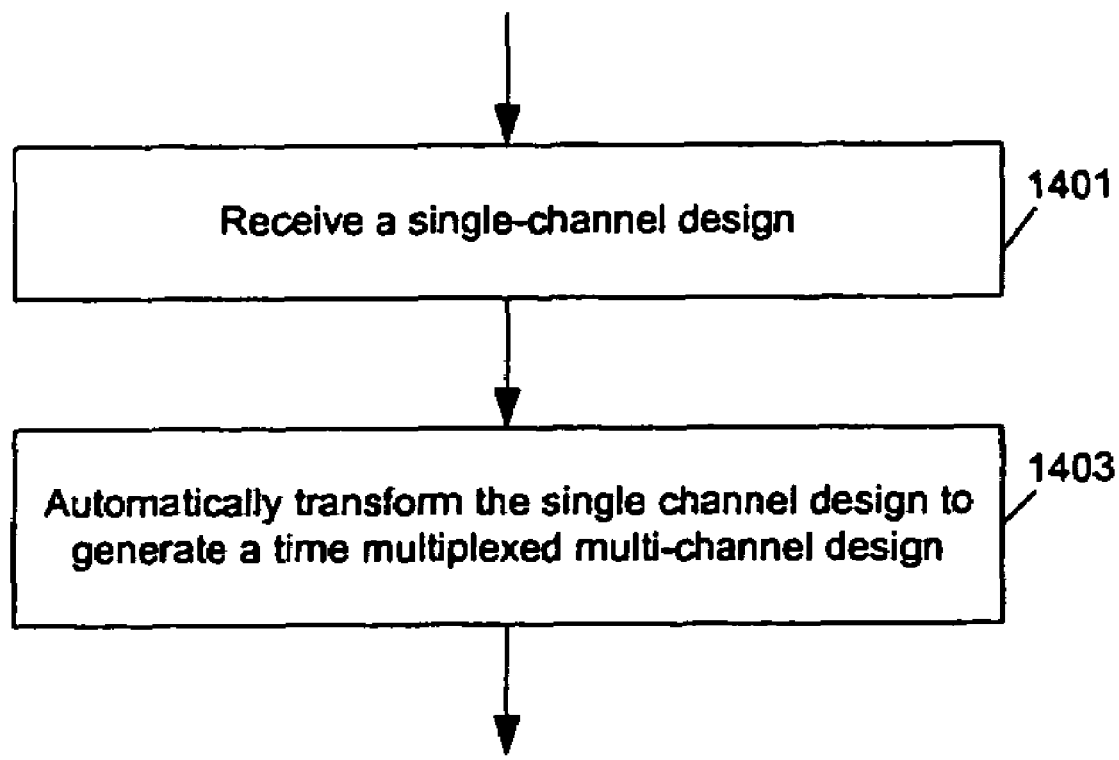
FIG. 14 shows a flow chart of a method to generate a multi-channel circuit from a single-channel circuit according to one embodiment of the present invention.

FIG. 14 shows a flow chart of a method to generate a multi-channel circuit from a single-channel circuit according to one embodiment of the present invention. After a single-channel design is received in operation 1401, operation 1403 automatically transforms the single-channel design to generate a time multiplexed multi-channel design. Since the transformation is based on a single-channel design, which has fewer logical elements than a conglomerate of single-channel systems, computational intensive operations of extracting high level parallelism are avoided.

Figure 15:
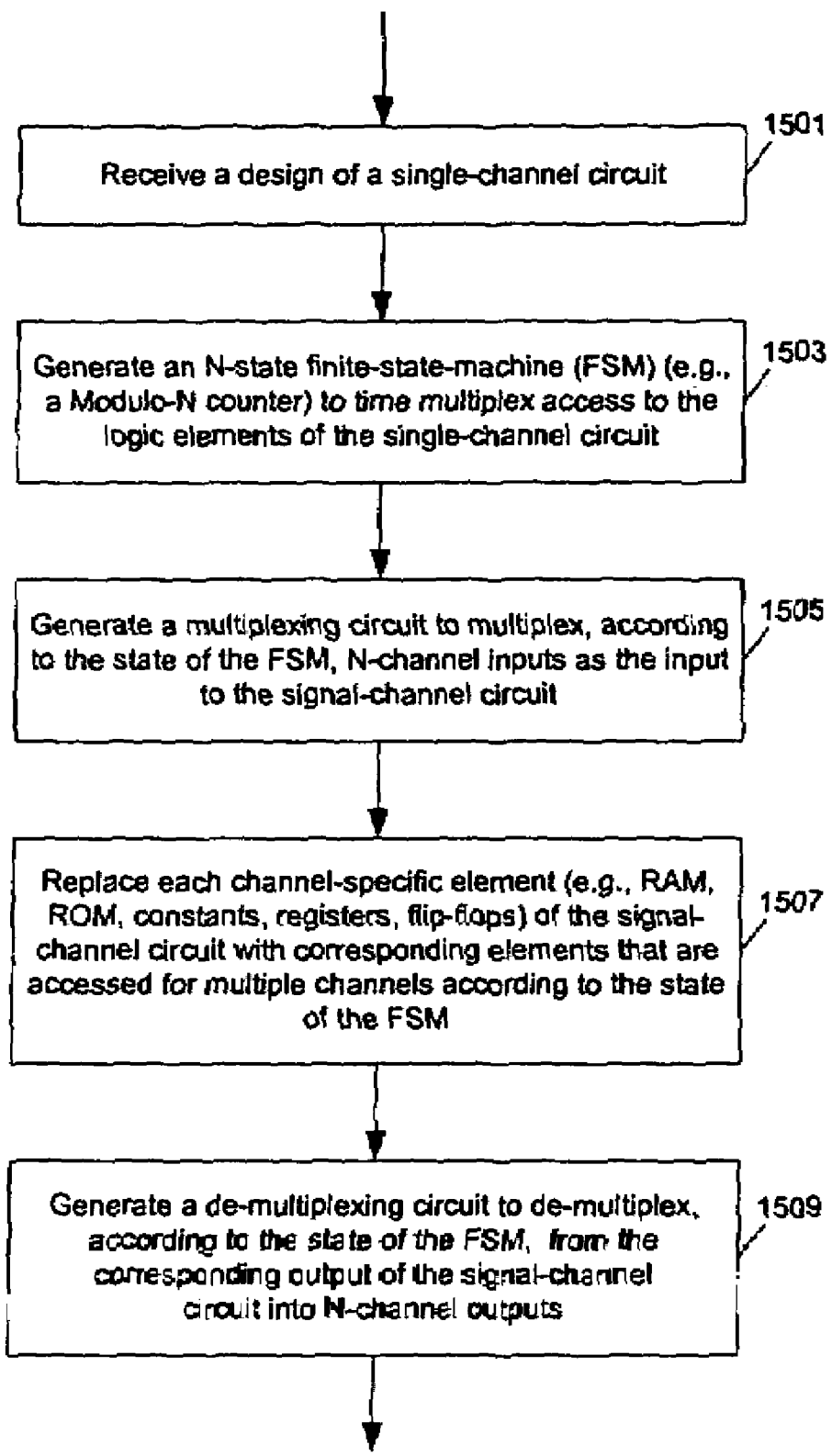
FIG. 15 shows a detailed flow chart of a method to generate a multi-channel circuit from a single-channel circuit according to one embodiment of the present invention.

FIG. 15 shows a detailed flow chart of a method to generate a multi-channel circuit from a single-channel circuit according to one embodiment of the present invention. Operation 1501 receives a design of a single-channel circuit. Operation 1503 generates an N-state finite-state-machine (FSM) (e.g., a Modulo-N counter) to time multiplex access to the logic elements of the single-channel circuit. Operation 1505 generates a multiplexing circuit to multiplex, according to the state of the FSM, N-channel inputs as the input to the single-channel circuit. Operation 1507 replaces each channel-specific element (e.g., RAM, ROM, constants, registers, flip-flops) of the single-channel circuit with corresponding elements that are accessed for multiple channels according to the state of the FSM. Operation 1509 generates a de-multiplexing circuit to de-multiplex, according to the state of the FSM, from the corresponding output of the single-channel circuit into N-channel outputs. After the above transformation, a multi-channel design is generated from the single-channel design.

Figure 16:
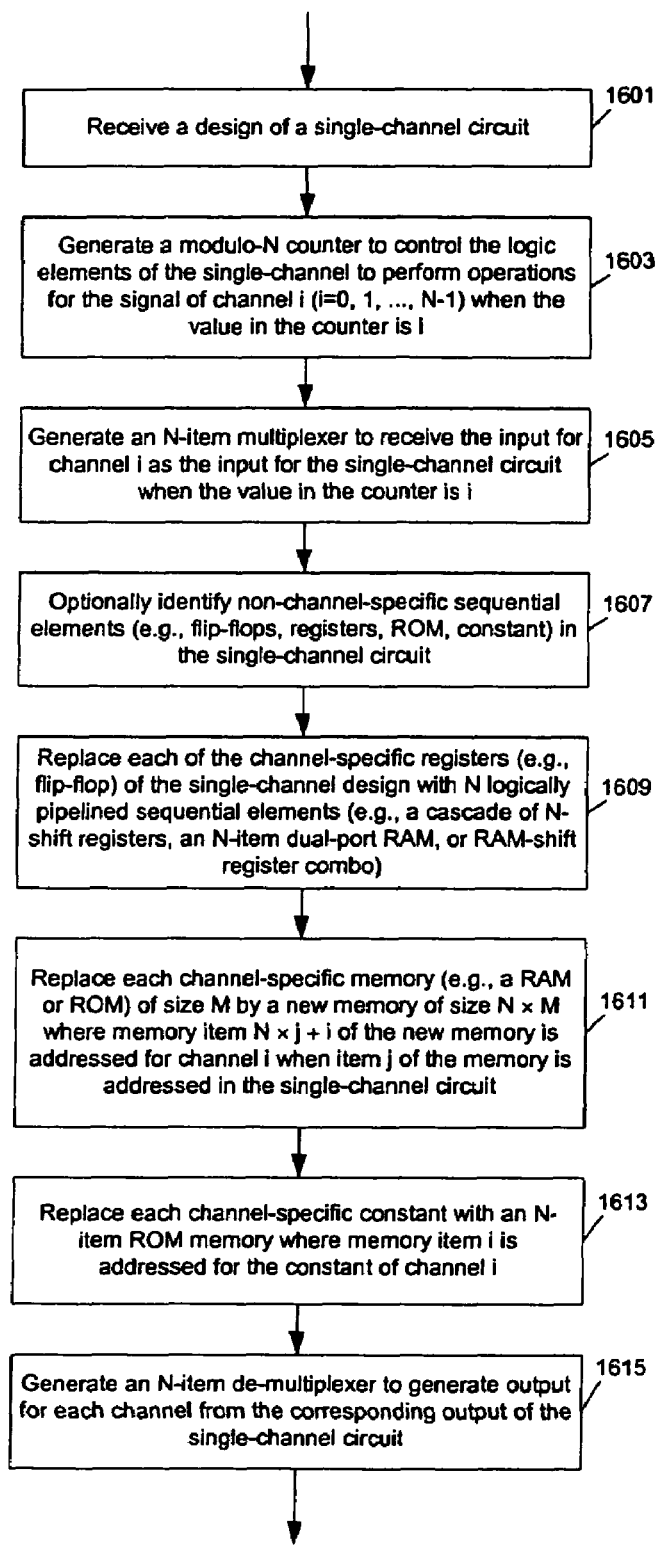
FIG. 16 shows an example method to generate a multi-channel circuit from a single-channel circuit according to one embodiment of the present invention.

FIG. 16 shows an example method to generate a multi-channel circuit from a single-channel circuit according to one embodiment of the present invention. Operation 1601 receives a design of a single-channel circuit. Operation 1603 generates a modulo-N counter to control the logic elements of the single-channel to perform operations for the signal of channel i (i=0, 1, . . . , N−1) when the value in the counter is i. Operation 1605 generates an N-item multiplexer to receive the input for channel i as the input for the single-channel circuit when the value in the counter is i. Operation 1607 optionally identifies non-channel-specific sequential elements (e.g., flip-flops, registers, ROM, constant, RAM) in the single-channel circuit. Operation 1609 replaces each of the channel-specific registers (e.g., flip-flop) of the single-channel design with N sequential elements (e.g., a cascade of N-shift registers, an N-item dual-port RAM, or RAM-shift register combo). Operation 1611 replaces each channel-specific memory (e.g., a RAM or ROM) of size M by a new memory of size N×M where memory item N×j+i of the new memory is addressed for channel i when item j of the memory is addressed in the single-channel circuit. Operation 1613 replaces each channel-specific constant with an N-item ROM memory where memory item i is addressed for the constant of channel i. Operation 1615 generates an N-item de-multiplexer to generate output for each channel from the corresponding output of the single-channel circuit.

In one embodiment of the present invention, a retiming algorithm (e.g., cutset retiming and pipelining, retiming for clock period minimization, such as those described in "VLSI digital signal processing systems: design and implementation", by Keshab K. Parhi, Wiley-Interscience, 1999, pp. 91-118, or others known in the art) is further used to improve the clock rate of the circuit, using the registers introduced during the automatic generation of the multi-channel circuit.

During the process of a circuit design, a negative latency register, which has a negative delay, can be used in an intermediate stage (e.g., in peripheral retiming, or in architectural retiming). While no physical negative latency register exists, it is understood that a negative latency register indicates a timing constraint at an intermediate state of design. Negative latency registers can be used in the early stage of the design process; and the negative latency registers are typically eliminated during the process of circuit design to achieve a final solution.

In one embodiment of the present invention, a single-channel system is specified with one or more negative latency registers; and, the negative latency registers can be transformed in a similar fashion as the regular registers.

Figure 17:
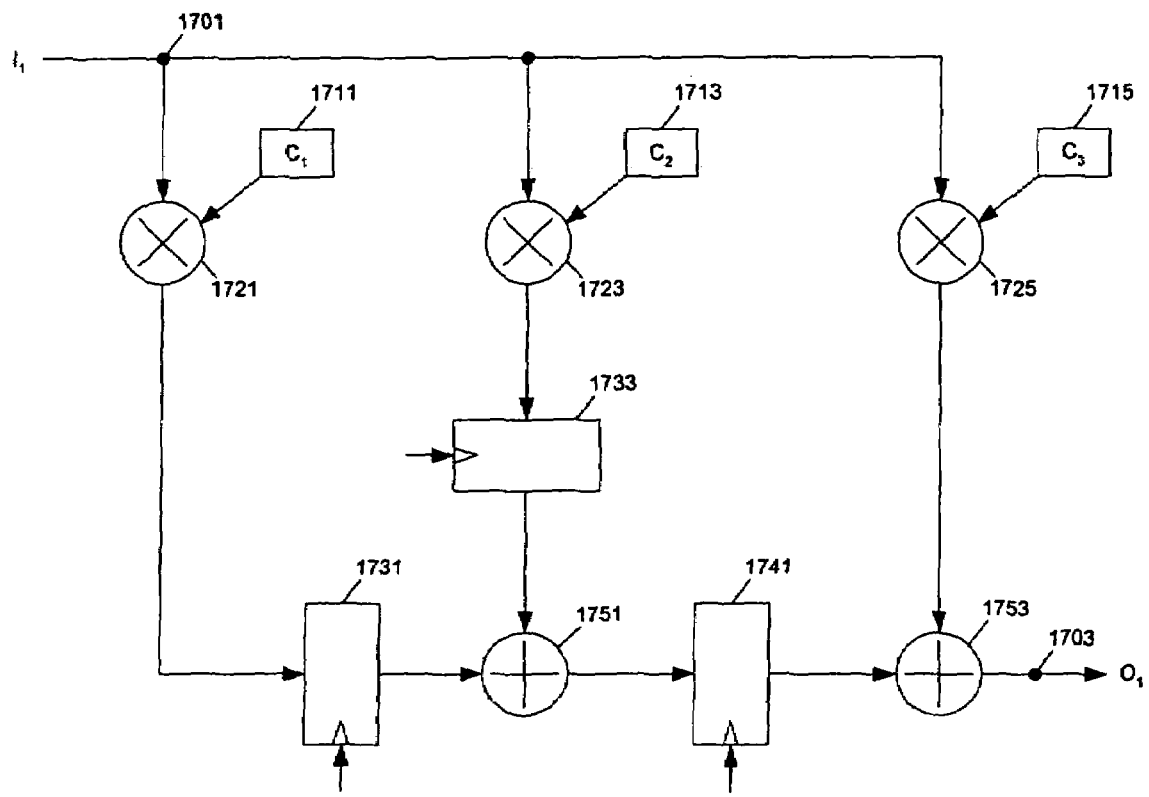
FIGS. 17-21 illustrate examples of generating a multi-channel circuit from a single-channel circuit with negative latency registers according to one embodiment of the present invention.

FIG. 17 shows an example of a single-channel system. For the purpose of illustration, the latency of elements other than registers is ignored. Each register (e.g., 1731, 1733 and 1741) has a one-unit latency. Elements 1711, 1713 and 1715 are constants, which do not change in time. Thus, assuming the input on line 1701 is $I_1(t)$, the signal on line 1703 is $I_1(t) \times C_3 + I_1(t-2) \times C_2 + I_1(t-2) \times C_1$. In FIG. 17, register 1731 stores the intermediate result from multiplier 1721 to generate $I_1(t-1) \times C_1$; and, register 1733 stores the intermediate result from multiplier 1723 to generate $I_1(t-1) \times C_1$. Register 1741 stores the intermediate result from adder 1751 to generate $I_1(t-2) \times C_2 + I_1(t-2) \times C_1$.

Figure 18:
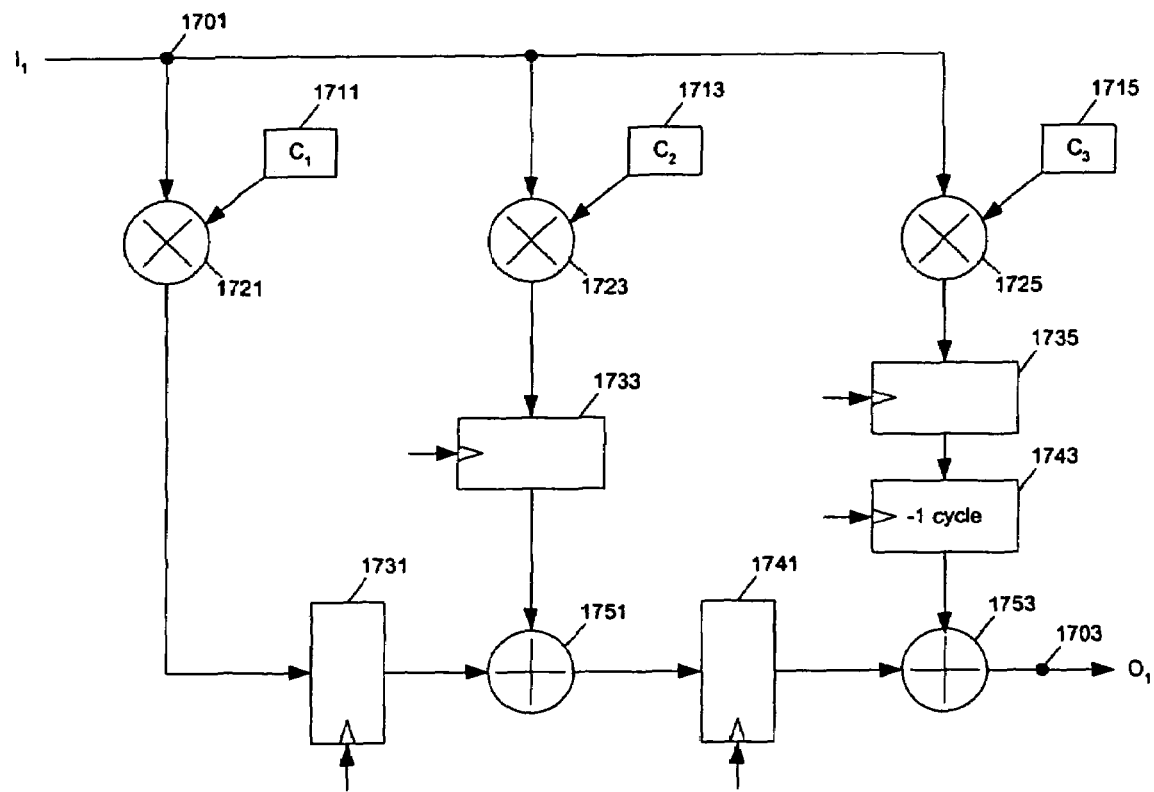
Figure 19:
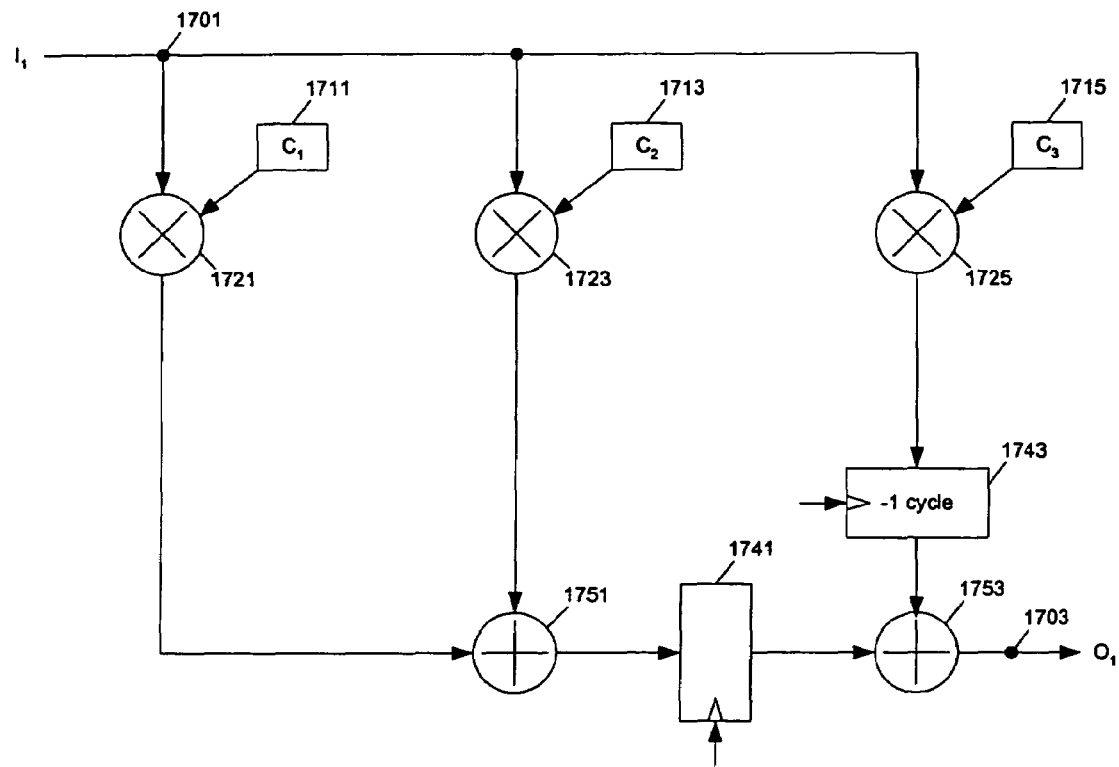
Figure 20:
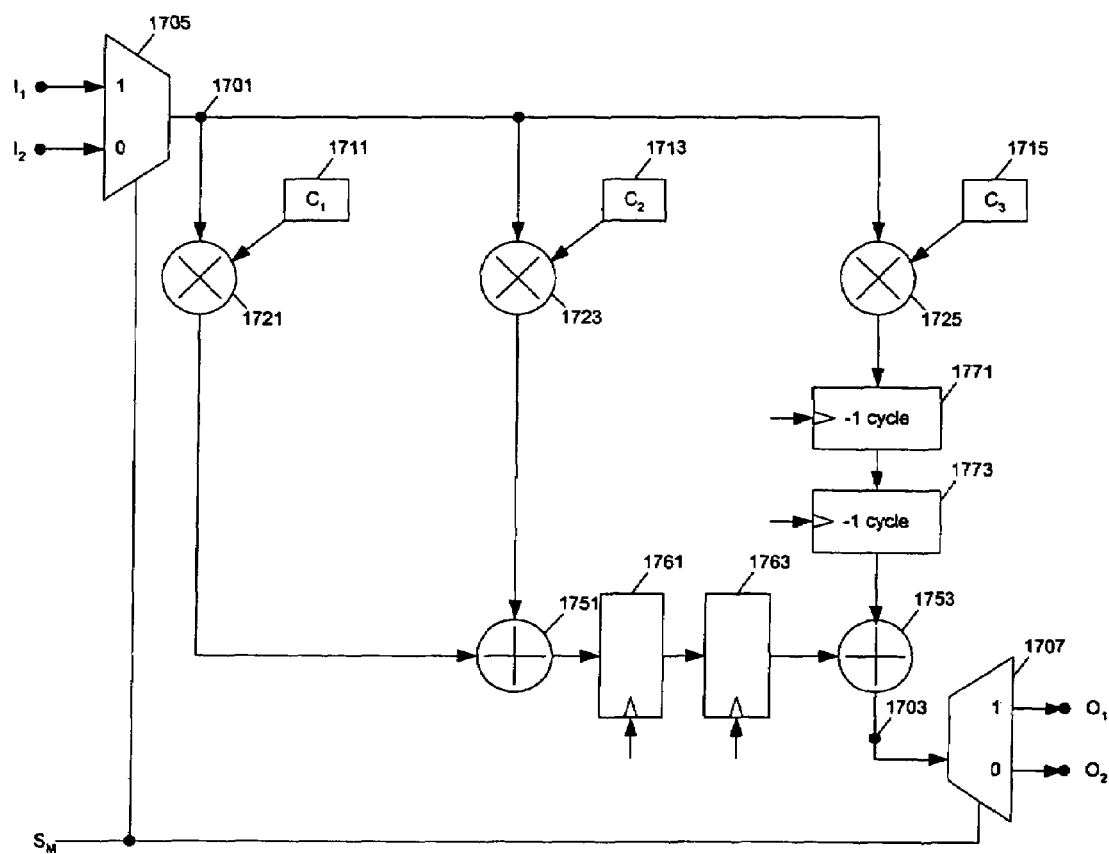
Figure 21:
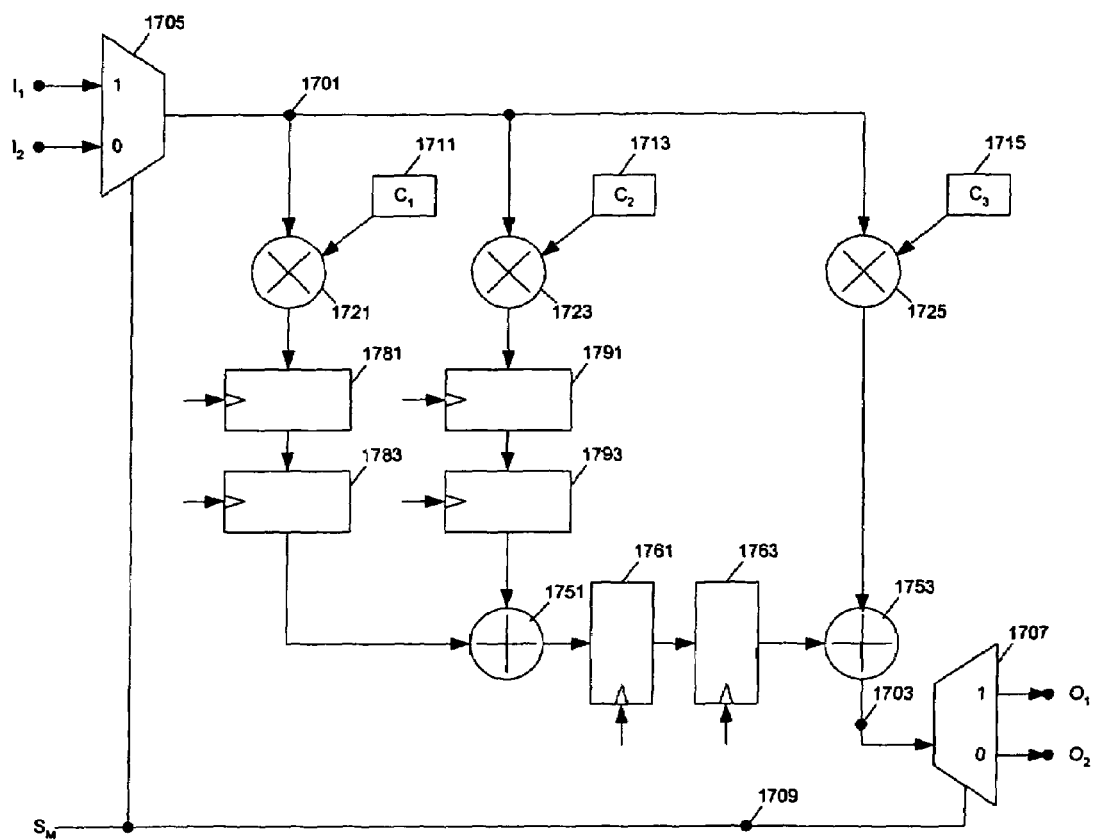
Figure 22:
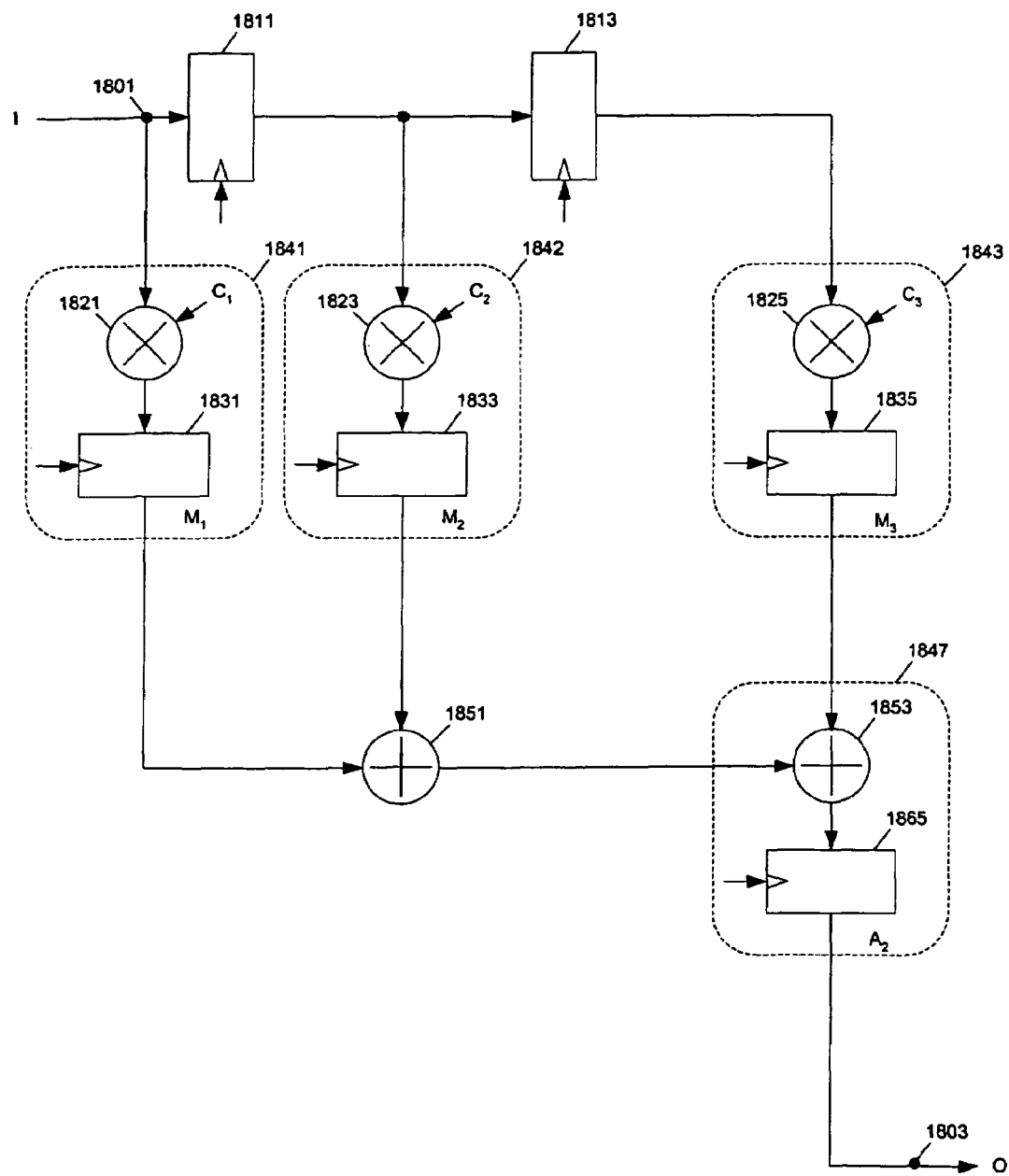
FIGS. 22-25 illustrate another example of generating a multi-channel circuit from a single-channel circuit using negative latency registers according to one embodiment of the present invention.

A pair of positive and negative latency registers can be inserted into path between multiplier 1725 and adder 1753. After the insertion, the circuit in FIG. 17 is transformed to that in FIG. 18. In FIG. 18, register 1743 is a negative latency register; and, register 1735 is a regular register (positive latency register). It is seen that in FIG. 18 registers 1731, 1733 and 1735 is a set of pipeline register. Note that the removal of the set of pipeline register (1731, 1733 and 1735) changes the latency of the signal-channel circuit (which may be acceptable or desirable in some instances); alternatively, a register (not shown in FIG. 19) can be inserted before point 1701 in FIG. 19 to have a single-channel circuit that has the same latency as that of the circuit in FIG. 18. Thus, the single-channel circuit in FIG. 18 can be specified as that in FIG. 19. In FIG. 19, assuming the input on line 1701 is $I_1(t)$, the output on line 1703 is $I_1(t+1) \times C_3 + I_1(t-1) \times C_2 + I_1(t-1) \times C_1$. Thus, apart from a one-unit timing shift, the circuit in FIG. 19 performs essentially the function as the circuit in FIG. 17 (or FIG. 18). When the circuit in FIG. 19 is specified as an input, a multi-channel circuit can be automatically generated. Registers 1741 and 1743 are not pipeline registers; and, they can be replace with multiple cascaded registers. FIG. 20 shows an example of a two-channel circuit automatically generated from the input of FIG. 19. Negative latency register 1743 in FIG. 19 is replaced with cascaded negative latency registers 1771 and 1773; and, register 1741 in FIG. 19 is replaced with cascaded registers 1761 and 1763. Multiplexer 1705 is added to feed the input signals into the shared channel one at a time; and, demultiplexer 1707 is added to restore the output from the shared channel one at a time. After the generation of the multi-channel circuit, a retiming algorithm (e.g., those described in "VLSI digital signal processing systems: design and implementation", by Keshab K. Parhi, Wiley-Interscience, 1999, pp. 91-118, or others known in the art) can be used to optimize the system. For example, pipeline register sets can be inserted into eliminate the negative latency registers. For example, two pipeline register sets can be inserted after multipliers 1721, 1723 and 1725 to generate the circuit in FIG. 21. Note that, as described previously, the insertion or deletion of pipeline register sets can change the timing for the generation of output on line 1703 in general; and thus, a proper number of registers (or delay elements) can be used on line 1709 to adjust the timing of the control signal for the demultiplexer 1707 (as illustrated in FIG. 11), the correspondence between the control signal and the output line can be adjusted (as illustrated in FIG. 13). It is seen that the circuit in FIG. 21 can be generated directly from the circuit of FIG. 17, according to embodiments of the present invention. Note that the two pipeline register sets can also be inserted after multipliers 1725 and adder 1751 in FIG. 20 to eliminate negative latency registers.

Further, in one embodiment of the present invention, one or more pairs of positive and negative latency registers are introduced into the single-channel system in the process of identifying pipeline registers. For example, after the single-channel circuit of FIG. 17 is received for the generation of multi-channel circuit, a positive and negative latency register pair (e.g., 1735 and 1743 in FIG. 18) is inserted for identifying pipeline registers. As illustrated in FIG. 18, once regular register 1735 and negative latency register 1743 are inserted, pipeline register sets (1731, 1733 and 1735) can be identified. Thus, only registers 1741 and 1743 of FIG. 18 are replaced with corresponding cascaded registers. Similarly, retiming algorithms can be used to further optimize the circuit of the automatic generation of the multi-channel circuit.

FIGS. 22-25 illustrate another example of generating a multi-channel circuit from a single-channel circuit using negative latency registers according to one embodiment of the present invention. The single-channel filter of FIG. 22 has pipelined adder 1847 ($A_2$) and pipelined multipliers 1841-1843 ($M_1$-$M_3$). A pipelined adder has an embedded register. For example, pipelined adder 1847 has register 1865, which is a physical part of the pipelined adder and cannot be moved out. Similarly, a pipelined multiplier also has an embedded register (e.g., pipelined multipliers 1841, 1842 and 1843 has registers 1831, 1833 and 1835 respectively).

Figure 23:
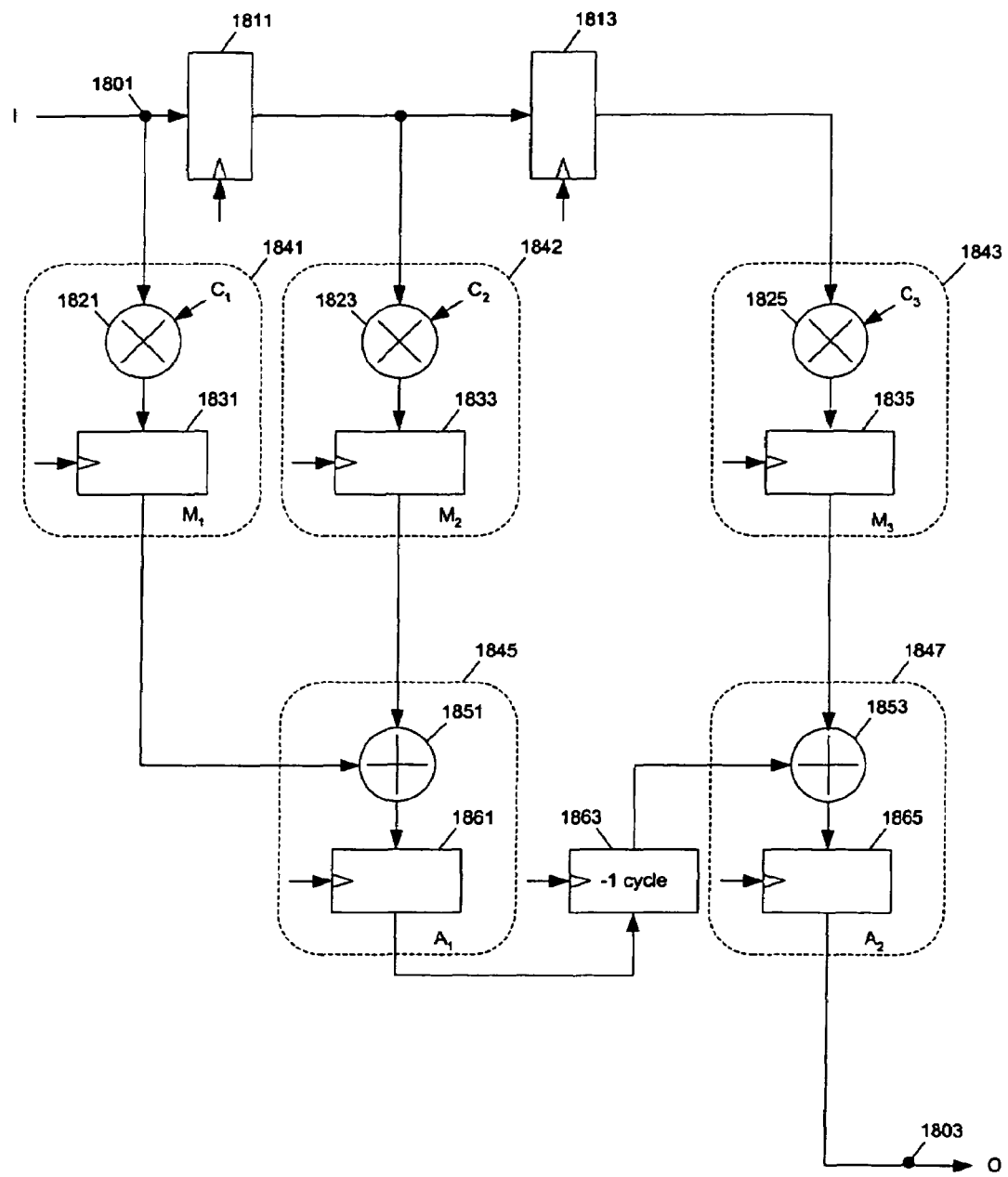
Figure 24:
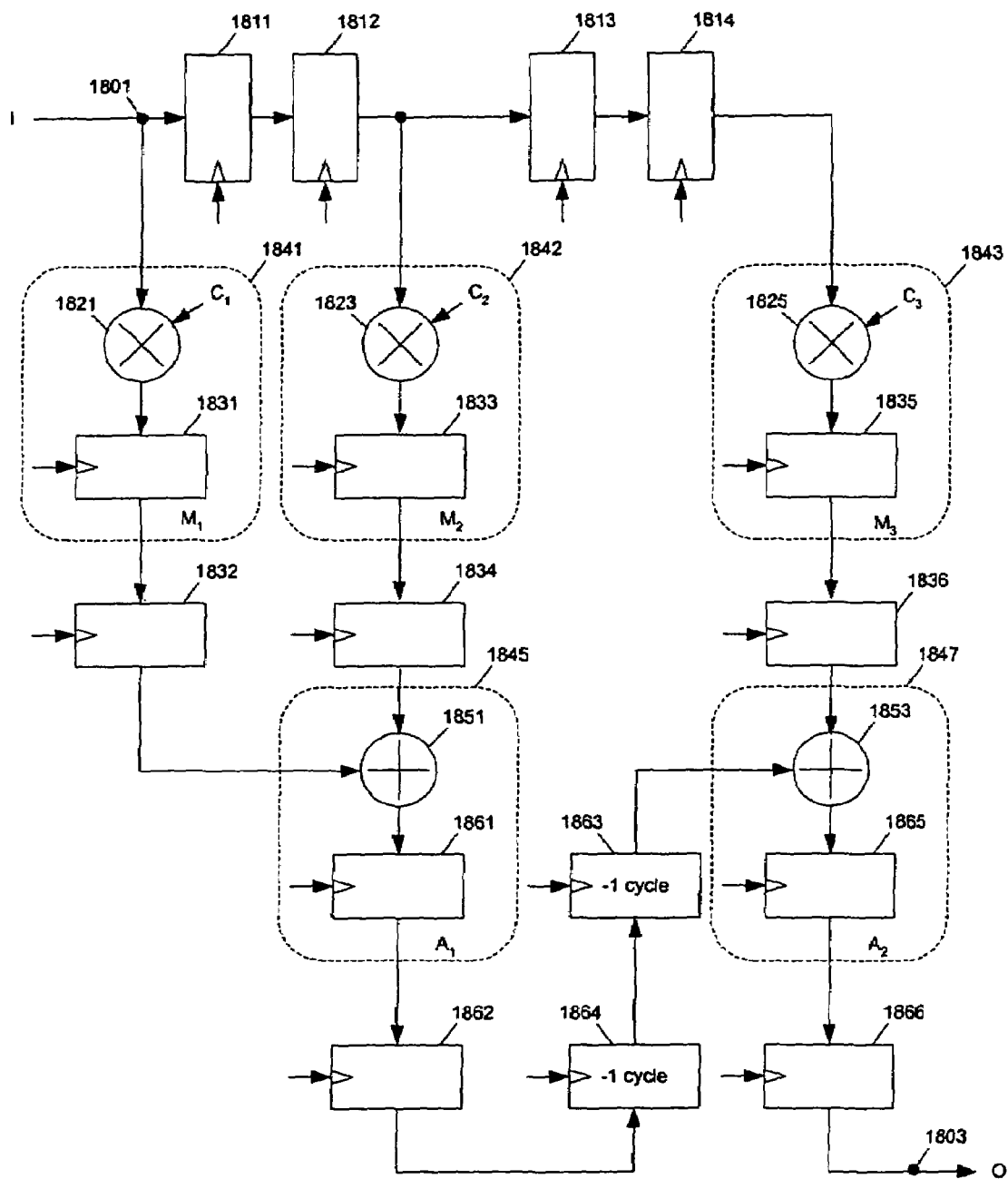

Consider that a pipelined adder is to be used to implement adder 1851. Without using a negative latency register, a set of regular registers may be added (e.g., on both the input lines for adder 1853) to provide adder 1851 a register. Such an approach can lead to the increase of the latency of the single channel system. Alternatively, FIG. 23 shows an example in which a pair of positive and negative latency registers (1861 and 1863) are added between adders 1851 and 1853. Thus, adder 1851 and register 1861 can be implemented as a pipelined adder 1845 ($A_1$). Note that negative latency register cannot be eliminated in the single-channel system even with retiming.

A multi-channel circuit can be automatically generated according to embodiments of the present invention. For example, FIG. 23 shows the time-shared portion of a multi-channel circuit, generated according to one embodiment of the present invention for a two-channel circuit. Note that the input multiplexing portion and the output de-multiplexing portion of the two-channel circuit are not shown in FIG. 24. Registers 1831, 1833 and 1835 are channel specific in FIG. 23; and, registers 1832, 1834 and 1836 are inserted in FIG. 24 for the multi-channel circuit. Similarly, registers 1861 and 1863 in FIG. 23 are replaced with cascaded register sets (1861,1862 and 1863 and 1864) in FIG. 24.

Figure 25:
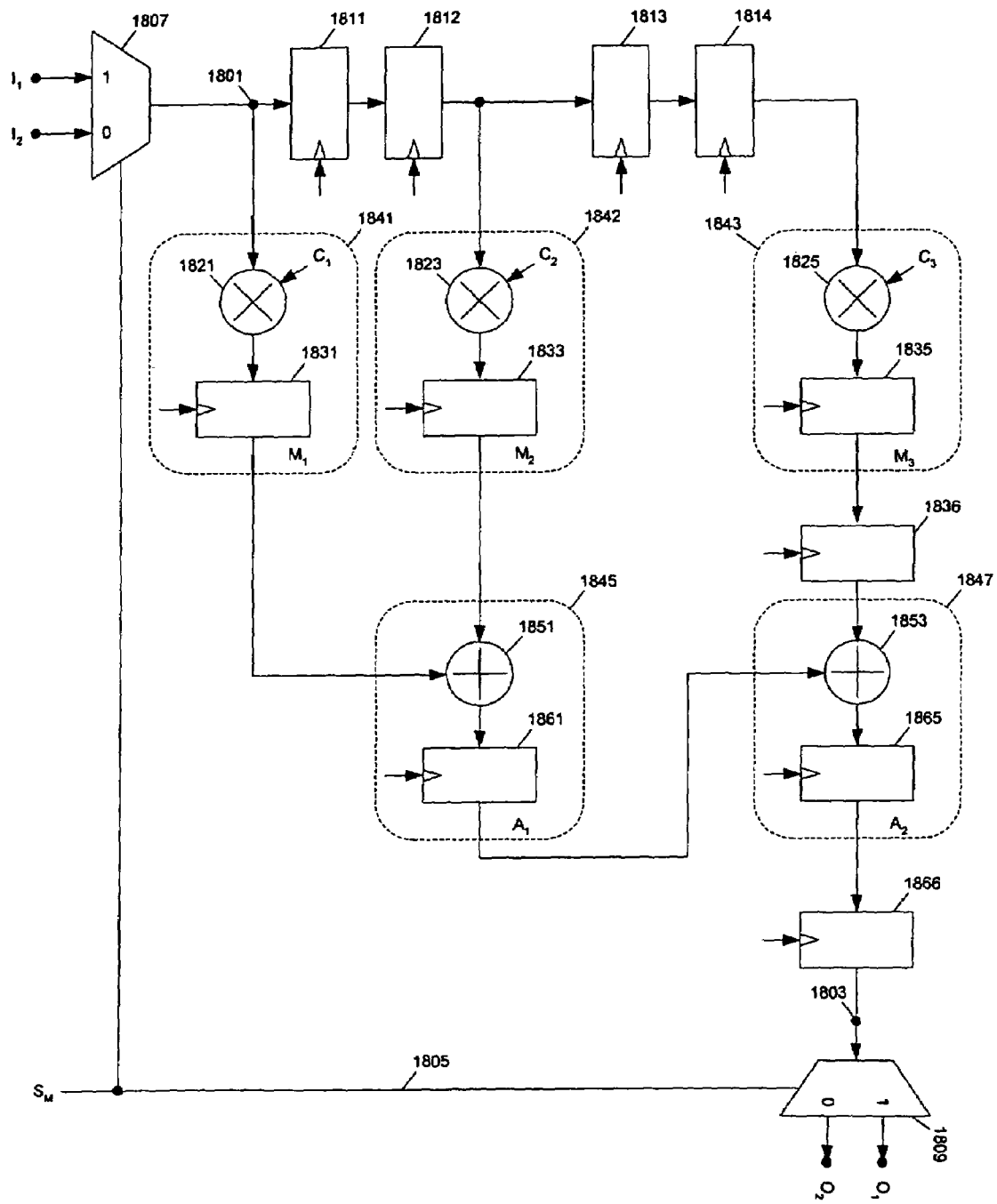

In the two-channel circuit generated according to one embodiment of the present invention, extra registers are generated for each of the pipelined operators. And, a retiming operation can be used to remove the negative registers. For example, registers 1832 and 1834 in FIG. 24 can be moved to the path between adders 1851 and 1853 in a retiming operation so that there are sufficient regular registers on the path between adders 1851 and 1853 to cancel out the negative registers (1863 and 1864). Thus, an example resulting two-channel circuit is shown in FIG. 25. In FIG. 25, multipliers 2821, 1823 and 1825 and adders 1851 and 1853 can be implemented as corresponding pipelined operators (pipelined multipliers 1841, 1842 and 1843 and pipelined adders 1845 and 1847). However, all negative latency registers are eliminated after retiming.

Pipelined adders and pipelined multipliers are illustrated in the above example. However, from this description, it will be appreciated that other pipelined logic elements or pipelined IP blocks can also be treated in a similar fashion.

In one embodiment of the present invention, no pipeline register sets are identified; and, all registers are considered as channel-specific. For example, an automatic method to transform a single-channel system into an N-channel system includes the following operations.

1. Generate a modulo-N counter as an N-state finite-state-machine (FSM). The state variable of the FSM is denoted as cnt. The m'th channel ($0 \leq m \leq N-1$) of the system is effectively activated when the FSM is in the m'th state (e.g., when cnt=m).

2. Replace each register by a cascade of N-shift registers (or alternatively, if N is large, each register can be replaced with an N-item dual-port RAM or a RAM-shift register combo).

3. Replace each RAM memory of size M by a RAM memory of size N×M. The address generation circuitry is modified or added to address the memory items such that memory item A of the single-channel design is replaced by an item at address N×A+cnt. It is understood that other address transformation scheme can also be used to logically pipeline memory items so that the output from the new memory is synchronized with the state of the FSM. The transformed address is typically a function of the original address, the state of the FSM, and the active channel number.

4. When there is a channel-specific ROM (e.g., ROM contents vary from channel to channel), apply a transform similar to that for the RAM so that ROM item N×A+m holds the contents of the ROM item A for m'th channel. If the ROM is not channel specific, no transformation is necessary.

5. If there is a channel-specific constant (e.g., constant value varies from channel to channel), replace it with an N-item ROM. The address line of the ROM is driven by cnt (or cnt−1 if there is one clock latency in ROM access). If the constant is not channel specific, no transformation is necessary.

The inputs of the different channels may be multiplexed over a common port. If multiple channels have their distinct input ports, multiplex these inputs by an N-item multiplexer with a selection line driven by cnt, which is N-times faster than the clock driving the inputs. Similarly, the outputs of the different channels may be multiplexed over a common port. If multiple channels have their distinct output ports, de-multiplex the outputs by an N-item decoder with a selection line driven by cnt. The outputs can be latched with an N-times slower clock. The other components of the single-channel design are kept as is as the shared resources through time multiplexing.

In another embodiment of the present invention, pipeline register sets are identified to avoid the generation of registers. For example, an automatic method to transform a single-channel system into an N-channel system includes the following operations.

1. Identify the pipeline registers in the system to cover as many and as wide registers as possible. There can be more than one set of pipeline registers, but the sets must be mutually exclusive. Any register not classified into any of the pipeline register sets is a state register. Pipeline registers are non-channel-specific; and, state registers are channel-specific. If there are P distinct pipeline register sets, the system is partitioned into P+1 disjoint subsystems, forming a singly linked list of subsystems. In this list, each feed-forward cutset defines a link, with the direction of the link indicating the direction of data flow. Denote $S_i$ the subsystem whose order in the linked list is i, where $0 \leq i \leq P$.

2. Generate P+1 N-state finite-state-machines (FSMs) from at least one modulo-N counter. Denote the state variable of i'th FSM ($0 \leq i \leq P$) as $cnt_i$. The hardware in subsystem $S_i$ processes the data of the m'th channel ($0 \leq m \leq N-1$) when the i'th FSM is in the m'th state (e.g., when $cnt_i$=m). When $mod((cnt_i-cnt_j),N)=mod((j-i), N)$ for $\forall i, j$ in [0,P], correct synchronization is maintained among the subsystems. This relation is satisfied if $cnt_i$ is a one-clock delayed version of $cnt_{i-1}$. (i=1,2, ..., N−1). Thus, $cnt_i$ can be derived from $cnt_{i-1}$ using a register; and, the FSMs can be implemented using one modulo-N counter and a cascade of registers.

3. Replace each state register with a cascade of N-shift registers (or alternatively, if N is large, each state register can be replaced with an N-item dual-port RAM or a RAM-shift register combo).

4. Replace each RAM memory of size M by a RAM memory of size N×M. For a RAM within the subsystem $S_i$, the address generation circuitry is modified or added to address the memory items such that memory item A of the single-channel design is replaced by an item at address N×A+$cnt_i$. It is understood that other address transformation scheme can also be used to logically pipeline memory items so that the output from the new memory is synchronized with the state of the i'th FSM. The transformed address is typically a function of the original address, the state of the i'th FSM, and the active channel number.

5. When there is a channel-specific ROM (e.g., ROM contents vary from channel to channel), apply a transform similar to that for the RAM so that ROM item N×A+m holds the contents of the ROM item A for m'th channel. If the ROM is not channel specific, no transformation is necessary.

6. If there is a channel-specific constant (e.g., constant value varies from channel to channel) within the subsystem $S_i$, replace it with an N-item ROM. The address line of the ROM is driven by $cnt_i$ (or $cnt_i$−1 if there is one clock latency in ROM access). If the constant is not channel specific, no transformation is necessary.

The inputs of the different channels may be multiplexed over a common port. If multiple channels have their distinct input ports, multiplex these inputs by an N-item multiplexer with a selection line driven by $cnt_0$, which is N-times faster than the clock driving the inputs. Similarly, the outputs of the different channels may be multiplexed over a common port. If multiple channels have their distinct output ports, de-multiplex the outputs by an N-item decoder with a selection line driven by $cnt_P$. The outputs can be latched with an N-times slower clock. The other components of the single-channel design are kept as is as the shared resources through time multiplexing.

Although P+1 N-state finite-state-machines can be used to control the timing of the P+1 subsystems individually, alternatively, one single N-state FSM can be used to control the operation of all subsystems, where different subsystems process for a given channel when the state of the FSM reaches different values. For example, the hardware in subsystem $S_i$ processes the data of the m'th channel ($0 \leq m \leq N-1$) when the FSM is in the state cnt=mod(m−i, N).

Pipeline register sets can be identified and removed, when timing constraints permit. For example, the set of pipeline registers 1011 in FIG. 10 can be removed to generate the design of FIG. 2; or, the pipeline register set 1011 of FIG. 11 can be removed automatically to generate the design of FIG. 7. Similarly, pipeline registers can also be added to a design automatically. Note that the addition or deletion of pipeline registers in general changes input to output latency of the circuit; however, such changes are acceptable for most cases.

In one embodiment of the present invention, employing shift registers with run-time-configurable depth and using modulo-N counters with run-time-configurable modulus, the folding rate N can be changed in run-time, without interrupting the operation. For the applications in which the number of active channels is a dynamic parameter, the folding rate can be adapted to the number of active channels, allowing the clock rate to be reduced, when possible, to reduce the power consumption.

Thus, at least one embodiment of the present invention automatically generates a design for a multi-channel system from the input of the design of single-channel system. The single-channel system design is automatically transformed into an N-channel system with time-multiplexed resource sharing of logical (computational) units. The transform is simple and very fast; and, the resulting design of the hardware is very efficient.

Since methods of various embodiment of the present invention generate a time-multiplexed multi-channel design from a single-channel design, fast optimization and synthesis operations can be performed on the reduced number of logic elements. The usage of control logic can be minimized. For some FPGA architectures, the memory usage of the synthesized system can be made very efficient. Further, various methods of the present invention allow for high pipeline orders and significant speed-ups.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method to design a digital circuit, the method comprising:
    receiving a first design of a single-channel circuit;
    generating a conglomerate of single-channel circuits of the first design and information indicating a multi-channel parallelism in the conglomerate of single-channel circuits; and
    applying a folding transformation to the conglomerate of single-channel circuits using the information to generate a second design of time multiplexed multi-channel circuit that has a plurality of independent channels,
    wherein the generating and applying are performed on a representation of a circuit design, the representation being stored in a memory of a data processing system which includes a processor which performs the generating and applying.

2. A method as in claim 1, wherein the information comprises information of a folding set.

3. A machine readable medium containing executable computer program instructions which when executed by a digital processing system cause said system to perform a method to design a digital circuit, the method comprising:
    receiving a first design of a single-channel circuit;
    generating a conglomerate of single-channel circuits of the first design and information indicating a multi-channel parallelism in the conglomerate of single-channel circuits; and
    applying a folding transformation to the conglomerate of single-channel circuits using the information to generate a second design of time multiplexed multi-channel circuit that has a plurality of independent channels,
    wherein the generating and applying are performed on a representation of a circuit design, the representation being stored in a memory of the data processing system which includes a processor which performs the generating and applying.

4. A medium as in claim 3, wherein the information comprises information of a folding set.

5. A digital processing system to design a digital circuit, the digital processing system comprising:
    means for receiving a first design of a single-channel circuit;
    means for generating a conglomerate of single-channel circuits of the first design and information indicating a multi-channel parallelism in the conglomerate of single-channel circuits; and
    means for applying a folding transformation to the conglomerate of single-channel circuits using the information to generate a second design of time multiplexed multi-channel circuit that has a plurality of independent channels,
    wherein the generating and applying are performed on a representation of a circuit design, the representation being stored in a memory of the data processing system which includes a processor which performs the generating and applying.

6. A digital processing system as in claim 5, wherein the information comprises information of a folding set.

* * * * *

UNITED STATES PATENT AND TRADEMARK OFFICE
CERTIFICATE OF CORRECTION

PATENT NO. : 7,640,519 B2 Page 1 of 1
APPLICATION NO. : 11/491437
DATED : December 29, 2009
INVENTOR(S) : Oktem et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 599 days.

Signed and Sealed this

Ninth Day of November, 2010

David J. Kappos
*Director of the United States Patent and Trademark Office*